United States Patent
Murthy et al.

(10) Patent No.: US 12,176,472 B2
(45) Date of Patent: Dec. 24, 2024

(54) LIGHT-EMITTING DIODE PACKAGES

(71) Applicant: CreeLED, Inc., Durham, NC (US)

(72) Inventors: Roshan Murthy, Raleigh, NC (US);
Kenneth M. Davis, Raleigh, NC (US);
Jae-Hyung Park, Cary, NC (US);
Xiameng Shi, Cary, NC (US)

(73) Assignee: CreeLED, Inc., Durham, NC (US)

( * ) Notice: Subject to any disclaimer, the term of this patent is extended or adjusted under 35 U.S.C. 154(b) by 345 days.

(21) Appl. No.: 17/238,934

(22) Filed: Apr. 23, 2021

(65) Prior Publication Data

US 2021/0265544 A1    Aug. 26, 2021

Related U.S. Application Data

(62) Division of application No. 16/118,747, filed on Aug. 31, 2018, now Pat. No. 11,024,785.
(Continued)

(51) Int. Cl.
*H01L 33/62* (2010.01)
*G02B 5/02* (2006.01)
(Continued)

(52) U.S. Cl.
CPC ............ *H01L 33/62* (2013.01); *G02B 5/0205* (2013.01); *G02B 27/0955* (2013.01);
(Continued)

(58) Field of Classification Search
CPC ......... H01L 24/04–06; H01L 23/12–15; H01L 23/62; H01L 23/498; H01L 23/49811;
(Continued)

(56) References Cited

U.S. PATENT DOCUMENTS

| | | | |
|---|---|---|---|
| 2,857,541 A | 10/1958 | Etzel et al. | |
| 4,918,497 A | 4/1990 | Edmond | |

(Continued)

FOREIGN PATENT DOCUMENTS

| | | | |
|---|---|---|---|
| CN | 102214651 A | 10/2011 | |
| CN | 103864302 A | 6/2014 | |

(Continued)

OTHER PUBLICATIONS

Second Office Action for Chinese Patent Application No. 2017800585182, dated Dec. 16, 2021, 9 pages.
(Continued)

*Primary Examiner* — Tucker J Wright
(74) *Attorney, Agent, or Firm* — Withrow & Terranova, P.L.L.C.

(57) ABSTRACT

Solid state light emitting devices including light-emitting diodes (LEDs), and more particularly packaged LEDs are disclosed. In some embodiments, an LED package includes electrical connections that are configured to reduce corrosion of metals within the LED package; or decrease the overall forward voltage of the LED package; or provide an electrical path for serially-connected electrostatic discharge (ESD) chips. In some embodiments, an LED package includes at least two LED chips and a material between the two LED chips that promotes homogeneity of composite emissions from the two LED chips. In this manner, LED packages according to the present disclosure may be beneficial for various applications, including those where a high luminous intensity is desired in a variety of environmental conditions. Such applications include automotive lighting, aerospace lighting, and general illumination.

21 Claims, 20 Drawing Sheets

Related U.S. Application Data

(60) Provisional application No. 62/676,697, filed on May 25, 2018.

(51) Int. Cl.

| | | |
|---|---|---|
| *G02B 27/09* | (2006.01) | |
| *H01L 21/66* | (2006.01) | |
| *H01L 23/00* | (2006.01) | |
| *H01L 25/075* | (2006.01) | |
| *H01L 25/16* | (2023.01) | |
| *H01L 27/02* | (2006.01) | |
| *H01L 33/10* | (2010.01) | |
| *H01L 33/50* | (2010.01) | |
| *H01L 33/60* | (2010.01) | |
| *H01L 33/64* | (2010.01) | |

(52) U.S. Cl.
CPC ............ *H01L 22/32* (2013.01); *H01L 24/04* (2013.01); *H01L 25/0753* (2013.01); *H01L 25/167* (2013.01); *H01L 27/0248* (2013.01); *H01L 33/10* (2013.01); *H01L 33/502* (2013.01); *H01L 33/60* (2013.01); *H01L 33/647* (2013.01)

(58) Field of Classification Search
CPC ......... H01L 23/49838; H01L 23/49861; H01L 23/49579; H01L 23/49503; H01L 23/49513; H01L 2224/05644; H01L 2224/05669; H01L 2224/05666; H01L 2224/05655; H01L 2224/05684
See application file for complete search history.

(56) References Cited

U.S. PATENT DOCUMENTS

| | | |
|---|---|---|
| 4,966,862 A | 10/1990 | Edmond |
| 5,027,168 A | 6/1991 | Edmond |
| 5,177,500 A | 1/1993 | Ng |
| 5,210,051 A | 5/1993 | Carter, Jr. |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,034,422 A | 3/2000 | Horita et al. |
| 6,120,600 A | 9/2000 | Edmond et al. |
| 6,187,606 B1 | 2/2001 | Edmond et al. |
| 6,201,262 B1 | 3/2001 | Edmond et al. |
| 6,274,399 B1 | 8/2001 | Kern et al. |
| 6,600,175 B1 | 7/2003 | Baretz et al. |
| 6,646,330 B2 | 11/2003 | Kubara et al. |
| 6,649,440 B1 | 11/2003 | Krames et al. |
| 6,791,119 B2 | 9/2004 | Slater, Jr. et al. |
| 6,808,391 B2 | 10/2004 | Yun |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,344,902 B2 | 3/2008 | Basin et al. |
| 7,361,938 B2 | 4/2008 | Mueller et al. |
| D572,387 S | 7/2008 | Uemoto et al. |
| D573,731 S | 7/2008 | Uemoto et al. |
| 7,456,499 B2 | 11/2008 | Loh et al. |
| 7,495,387 B2 | 2/2009 | Hayashi et al. |
| 7,564,180 B2 | 7/2009 | Brandes |
| D597,502 S | 8/2009 | Ogata et al. |
| 7,655,957 B2 | 2/2010 | Loh et al. |
| D611,628 S | 3/2010 | Uemoto et al. |
| D612,958 S | 3/2010 | Uemoto et al. |
| 7,754,507 B2 | 7/2010 | Epler et al. |
| 7,791,061 B2 | 9/2010 | Edmond et al. |
| 7,802,901 B2 | 9/2010 | McMillan |
| 7,821,023 B2 | 10/2010 | Yuan et al. |
| 7,847,303 B2 | 12/2010 | Jung et al. |
| 7,928,648 B2 | 4/2011 | Jang et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van De Ven et al. |
| 8,044,418 B2 | 10/2011 | Loh et al. |
| 8,058,088 B2 | 11/2011 | Cannon et al. |
| 8,075,165 B2 | 12/2011 | Jiang et al. |
| 8,097,894 B2 | 1/2012 | Bierhuizen et al. |
| 8,123,384 B2 | 2/2012 | Negley et al. |
| 8,125,137 B2 | 2/2012 | Medendorp, Jr. et al. |
| 8,232,564 B2 | 7/2012 | Chakraborty |
| 8,264,138 B2 | 9/2012 | Negley et al. |
| 8,337,071 B2 | 12/2012 | Negley et al. |
| 8,362,512 B2 | 1/2013 | Hussell et al. |
| 8,384,097 B2 | 2/2013 | Yan |
| 8,390,022 B2 | 3/2013 | Hussell et al. |
| 8,410,679 B2 | 4/2013 | Ibbetson et al. |
| 8,425,271 B2 | 4/2013 | Hussell et al. |
| 8,461,610 B2 | 6/2013 | Ito et al. |
| 8,492,788 B2 | 7/2013 | Veerasamy et al. |
| 8,563,339 B2 | 10/2013 | Tarsa et al. |
| 8,598,793 B2 | 12/2013 | Yan et al. |
| 8,671,440 B2 | 3/2014 | Damola et al. |
| D703,841 S | 4/2014 | Feng et al. |
| 8,729,589 B2 | 5/2014 | Hussell et al. |
| 8,759,124 B2 | 6/2014 | Miyoshi et al. |
| 8,822,032 B2 | 9/2014 | Borrelli et al. |
| 8,833,661 B2 | 9/2014 | Terwilliger et al. |
| 8,866,410 B2 | 10/2014 | Negley et al. |
| 8,940,561 B2 | 1/2015 | Donofrio et al. |
| 8,970,131 B2 | 3/2015 | Brandes et al. |
| 8,998,444 B2 | 4/2015 | Roberts et al. |
| 9,024,340 B2 | 5/2015 | Minato et al. |
| 9,024,349 B2 | 5/2015 | Chitnis et al. |
| 9,053,958 B2 | 6/2015 | Donofrio et al. |
| 9,082,921 B2 | 7/2015 | Wilcox et al. |
| 9,131,561 B2 | 9/2015 | Athalye |
| 9,159,888 B2 | 10/2015 | Chitnis et al. |
| 9,172,012 B2 | 10/2015 | Andrews et al. |
| 9,192,013 B1 | 11/2015 | van de Ven et al. |
| 9,277,605 B2 | 3/2016 | Ni |
| 9,310,026 B2 | 4/2016 | Negley |
| 9,318,674 B2 | 4/2016 | Jussell et al. |
| D756,547 S | 5/2016 | Zhang et al. |
| 9,331,253 B2 | 5/2016 | Clatterbuck |
| 9,379,094 B2 | 6/2016 | Wada et al. |
| 9,414,454 B2 | 8/2016 | Brandes et al. |
| 9,461,214 B2 | 10/2016 | Beppu |
| 9,461,222 B1 | 10/2016 | Wei |
| 9,496,465 B2 | 11/2016 | Sugimoto et al. |
| 9,583,682 B2 | 2/2017 | Wada et al. |
| 9,620,733 B2 | 4/2017 | Kim et al. |
| 9,653,643 B2 | 5/2017 | Bergmann et al. |
| 9,713,211 B2 | 7/2017 | van de Ven et al. |
| 9,735,198 B2 | 8/2017 | Joo et al. |
| D797,321 S | 9/2017 | Liu |
| 9,779,966 B2 | 10/2017 | Sakai et al. |
| 9,793,247 B2 | 10/2017 | Yuan et al. |
| 9,816,691 B2 | 11/2017 | Yan |
| 9,893,243 B2 | 2/2018 | West et al. |
| 9,941,449 B2 | 4/2018 | Wada et al. |
| 10,057,983 B1 | 8/2018 | Etzkorn et al. |
| 10,109,615 B2 | 10/2018 | Oka |
| 10,128,420 B2 | 11/2018 | Chang et al. |
| 10,186,633 B2 | 1/2019 | Shichijo et al. |
| 10,211,187 B2 | 2/2019 | Crompvoets et al. |
| 10,267,506 B2 | 4/2019 | Tudorica et al. |
| 10,290,777 B2 | 5/2019 | Andrews et al. |
| D851,790 S | 6/2019 | Reiherzer et al. |
| 10,439,107 B2 | 10/2019 | Heikman et al. |
| 10,522,727 B2 | 12/2019 | Minato et al. |
| 10,529,696 B2 | 1/2020 | Edmond et al. |
| 10,588,184 B2 | 3/2020 | Tseng et al. |

(56) References Cited

U.S. PATENT DOCUMENTS

| | | |
|---|---|---|
| 10,651,351 B1 | 5/2020 | Hussell |
| 10,651,353 B2 | 5/2020 | Senuki et al. |
| 2002/0123164 A1 | 9/2002 | Slater, Jr. et al. |
| 2003/0006418 A1 | 1/2003 | Emerson et al. |
| 2004/0048219 A1 | 3/2004 | Yun |
| 2004/0056260 A1 | 3/2004 | Slater, Jr. et al. |
| 2005/0127381 A1 | 6/2005 | Vitta et al. |
| 2005/0127385 A1 | 6/2005 | Reeh et al. |
| 2005/0269582 A1 | 12/2005 | Mueller et al. |
| 2005/0269587 A1 | 12/2005 | Loh et al. |
| 2006/0105485 A1 | 5/2006 | Basin et al. |
| 2006/0152140 A1 | 7/2006 | Brandes |
| 2006/0221272 A1 | 10/2006 | Negley et al. |
| 2006/0281203 A1 | 12/2006 | Epler et al. |
| 2007/0029569 A1* | 2/2007 | Andrews .......... H01L 33/52 257/E33.059 |
| 2007/0104828 A1 | 5/2007 | Fornaguera |
| 2007/0139923 A1 | 6/2007 | Negley et al. |
| 2007/0158668 A1 | 7/2007 | Tarsa et al. |
| 2007/0170447 A1 | 7/2007 | Negley et al. |
| 2007/0223219 A1 | 9/2007 | Medendorp, Jr. et al. |
| 2007/0241661 A1 | 10/2007 | Yin |
| 2007/0241666 A1 | 10/2007 | Jang et al. |
| 2007/0253209 A1 | 11/2007 | Loh et al. |
| 2008/0012036 A1 | 1/2008 | Loh et al. |
| 2008/0036940 A1 | 2/2008 | Song et al. |
| 2008/0054279 A1 | 3/2008 | Hussell et al. |
| 2008/0121921 A1 | 5/2008 | Loh et al. |
| 2008/0173884 A1 | 7/2008 | Chitnis et al. |
| 2008/0179611 A1 | 7/2008 | Chitnis et al. |
| 2008/0198112 A1 | 8/2008 | Roberts |
| 2008/0258130 A1 | 10/2008 | Bergmann et al. |
| 2008/0308825 A1 | 12/2008 | Chakraborty et al. |
| 2009/0001490 A1 | 1/2009 | Bogner et al. |
| 2009/0021841 A1 | 1/2009 | Negley et al. |
| 2009/0039375 A1 | 2/2009 | LoToquin et al. |
| 2009/0050907 A1 | 2/2009 | Yuan et al. |
| 2009/0050908 A1 | 2/2009 | Yuan et al. |
| 2009/0051022 A1 | 2/2009 | Andoh |
| 2009/0057690 A1 | 3/2009 | Chakraborty |
| 2009/0080185 A1 | 3/2009 | McMillan |
| 2009/0160363 A1 | 6/2009 | Negley et al. |
| 2009/0166665 A1 | 7/2009 | Haitko |
| 2009/0179213 A1 | 7/2009 | Cannon et al. |
| 2009/0184616 A1 | 7/2009 | Van De Ven et al. |
| 2009/0261708 A1 | 10/2009 | Moseri et al. |
| 2009/0267090 A1 | 10/2009 | Chang et al. |
| 2009/0316409 A1 | 12/2009 | Kim et al. |
| 2010/0079059 A1 | 4/2010 | Roberts et al. |
| 2010/0090233 A1 | 4/2010 | Hussell et al. |
| 2010/0091499 A1 | 4/2010 | Jiang et al. |
| 2010/0154035 A1 | 6/2010 | Damola et al. |
| 2010/0155763 A1 | 6/2010 | Donofrio et al. |
| 2010/0244060 A1 | 9/2010 | Lee et al. |
| 2010/0259930 A1 | 10/2010 | Yan |
| 2010/0320479 A1 | 12/2010 | Minato et al. |
| 2010/0320928 A1 | 12/2010 | Kaihotsu et al. |
| 2011/0018017 A1 | 1/2011 | Bierhuizen et al. |
| 2011/0031516 A1 | 2/2011 | Basin et al. |
| 2011/0049545 A1 | 3/2011 | Basin et al. |
| 2011/0068702 A1 | 3/2011 | van de Ven et al. |
| 2011/0096526 A1 | 4/2011 | Katabe et al. |
| 2011/0169033 A1 | 7/2011 | Fukunaga et al. |
| 2011/0180822 A1 | 7/2011 | Ruhnau et al. |
| 2011/0254022 A1 | 10/2011 | Sasano |
| 2011/0309388 A1 | 12/2011 | Ito et al. |
| 2012/0018754 A1 | 1/2012 | Lowes |
| 2012/0061692 A1 | 3/2012 | Chang et al. |
| 2012/0068594 A1 | 3/2012 | Ibbetson et al. |
| 2012/0086023 A1 | 4/2012 | Veerasamy et al. |
| 2012/0104428 A1 | 5/2012 | Hussell et al. |
| 2012/0104452 A1 | 5/2012 | Miyoshi et al. |
| 2012/0107622 A1 | 5/2012 | Borrelli et al. |
| 2012/0111471 A1 | 5/2012 | Negley et al. |
| 2012/0193651 A1 | 8/2012 | Edmond et al. |
| 2012/0286669 A1 | 11/2012 | Yan et al. |
| 2012/0305949 A1 | 12/2012 | Donofrio et al. |
| 2012/0306355 A1 | 12/2012 | Seibel, II |
| 2012/0313131 A1 | 12/2012 | Oda et al. |
| 2013/0033169 A1 | 2/2013 | Ito et al. |
| 2013/0057593 A1 | 3/2013 | Morishita |
| 2013/0069535 A1 | 3/2013 | Athalye |
| 2013/0069536 A1 | 3/2013 | Ni |
| 2013/0069781 A1 | 3/2013 | Terwilliger et al. |
| 2013/0077299 A1 | 3/2013 | Hussell et al. |
| 2013/0092960 A1 | 4/2013 | Wilcox et al. |
| 2013/0221509 A1 | 8/2013 | Oda et al. |
| 2013/0256710 A1 | 10/2013 | Andrews et al. |
| 2013/0256711 A1 | 10/2013 | Joo et al. |
| 2013/0264589 A1 | 10/2013 | Bergmann et al. |
| 2013/0271991 A1 | 10/2013 | Hussell et al. |
| 2013/0301257 A1 | 11/2013 | Britt et al. |
| 2014/0138725 A1 | 5/2014 | Oyamada |
| 2014/0217325 A1 | 8/2014 | Manabe et al. |
| 2014/0217435 A1 | 8/2014 | Manabe et al. |
| 2014/0217436 A1 | 8/2014 | Hussell et al. |
| 2014/0217443 A1 | 8/2014 | Heikman et al. |
| 2014/0232288 A1 | 8/2014 | Brandes et al. |
| 2014/0232289 A1 | 8/2014 | Brandes et al. |
| 2014/0239320 A1 | 8/2014 | Miyoshi et al. |
| 2014/0367713 A1 | 12/2014 | Zhang et al. |
| 2015/0028372 A1 | 1/2015 | Nakanishi et al. |
| 2015/0062915 A1 | 3/2015 | Hussell et al. |
| 2015/0155447 A1 | 6/2015 | Beppu |
| 2015/0204525 A1 | 7/2015 | Shen et al. |
| 2015/0207045 A1 | 7/2015 | Wada et al. |
| 2015/0249196 A1 | 9/2015 | Williams et al. |
| 2015/0257211 A1 | 9/2015 | Johnson et al. |
| 2015/0262987 A1 | 9/2015 | Wada et al. |
| 2015/0263247 A1 | 9/2015 | Wada et al. |
| 2015/0267906 A1 | 9/2015 | Wilcox |
| 2015/0349218 A1 | 12/2015 | Reiherzer et al. |
| 2015/0359050 A1 | 12/2015 | van de Ven et al. |
| 2015/0364660 A1 | 12/2015 | Huang et al. |
| 2015/0380322 A1 | 12/2015 | Shimonishi et al. |
| 2016/0064623 A1 | 3/2016 | Clatterbuck |
| 2016/0074833 A1 | 3/2016 | O'Brien et al. |
| 2016/0079486 A1 | 3/2016 | Sugimoto et al. |
| 2016/0093777 A1 | 3/2016 | Sato et al. |
| 2016/0111600 A1 | 4/2016 | Chae et al. |
| 2016/0126010 A1 | 5/2016 | Wang |
| 2016/0126434 A1 | 5/2016 | Nakabayashi |
| 2016/0161098 A1 | 6/2016 | Tudorica et al. |
| 2016/0293811 A1 | 10/2016 | Hussell et al. |
| 2016/0341402 A1 | 11/2016 | Yan |
| 2016/0351846 A1 | 12/2016 | Kim et al. |
| 2017/0018687 A1 | 1/2017 | West et al. |
| 2017/0040183 A1 | 2/2017 | Sakai et al. |
| 2017/0092820 A1 | 3/2017 | Kim et al. |
| 2017/0098746 A1 | 4/2017 | Bergmann et al. |
| 2017/0154880 A1 | 6/2017 | Ozeki et al. |
| 2017/0155022 A1 | 6/2017 | Tomonari et al. |
| 2017/0207202 A1 | 7/2017 | Crompvoets et al. |
| 2017/0263828 A1 | 9/2017 | Mao et al. |
| 2017/0294417 A1 | 10/2017 | Edmond et al. |
| 2017/0299798 A1 | 10/2017 | Son |
| 2017/0301832 A1 | 10/2017 | Basin et al. |
| 2017/0345985 A1 | 11/2017 | Ide |
| 2017/0358624 A1 | 12/2017 | Takeya et al. |
| 2017/0358724 A1 | 12/2017 | Shichijo et al. |
| 2017/0373225 A1 | 12/2017 | Shichijo et al. |
| 2018/0012949 A1 | 1/2018 | Takeya et al. |
| 2018/0033924 A1 | 2/2018 | Andrews et al. |
| 2018/0043178 A1 | 2/2018 | Iguchi et al. |
| 2018/0069164 A1 | 3/2018 | Minato et al. |
| 2018/0076368 A1 | 3/2018 | Hussell |
| 2018/0102348 A1 | 4/2018 | Haiberger et al. |
| 2018/0102449 A1 | 4/2018 | Pschenitzka et al. |
| 2018/0103513 A1 | 4/2018 | Tseng et al. |
| 2018/0130776 A1 | 5/2018 | Oka |
| 2018/0190880 A1 | 7/2018 | Vampola et al. |
| 2018/0190881 A1 | 7/2018 | Lin |
| 2018/0190885 A1 | 7/2018 | Chang et al. |
| 2019/0122592 A1 | 4/2019 | Han et al. |

(56) References Cited

U.S. PATENT DOCUMENTS

| | | | |
|---|---|---|---|
| 2019/0148346 | A1 | 5/2019 | Feichtinger et al. |
| 2019/0165231 | A1 | 5/2019 | Doan et al. |
| 2019/0237638 | A1 | 8/2019 | Andrews et al. |
| 2019/0312187 | A1 | 10/2019 | Harada et al. |
| 2019/0326484 | A1 | 10/2019 | Welch et al. |
| 2019/0363223 | A1 | 11/2019 | Murthy et al. |
| 2019/0363232 | A1 | 11/2019 | Murthy et al. |
| 2020/0075813 | A1 | 3/2020 | Joo et al. |
| 2020/0075822 | A1 | 3/2020 | Suich et al. |
| 2020/0152840 | A1 | 5/2020 | Hussell |

FOREIGN PATENT DOCUMENTS

| | | |
|---|---|---|
| CN | 204088306 U | 1/2015 |
| EP | 1710846 A1 | 10/2006 |
| EP | 2216834 A1 | 8/2010 |
| EP | 2819191 A1 | 2/2013 |
| EP | 2768037 A1 | 8/2014 |
| EP | 2804225 A1 | 11/2014 |
| EP | 2927970 A1 | 10/2015 |
| JP | S54105772 A | 8/1979 |
| JP | H0294524 A | 4/1990 |
| JP | 2010267857 A | 11/2010 |
| JP | 2011129772 A | 6/2011 |
| JP | 2012199416 A | 10/2012 |
| JP | 2013153157 A | 8/2013 |
| JP | 2017108091 A | 6/2017 |
| WO | 2007034367 A1 | 3/2007 |
| WO | 2011007275 A1 | 1/2011 |
| WO | 2011097137 A1 | 8/2011 |
| WO | 2011112914 A2 | 9/2011 |
| WO | 2012058040 A1 | 5/2012 |
| WO | 2013003627 A1 | 1/2013 |
| WO | 2013154818 A1 | 10/2013 |
| WO | 2013188189 A2 | 12/2013 |
| WO | 2014024108 A1 | 2/2014 |
| WO | 2014133294 A1 | 9/2014 |
| WO | 2014159894 A1 | 10/2014 |
| WO | 2015026033 A1 | 2/2015 |
| WO | 2018022456 A1 | 2/2018 |

OTHER PUBLICATIONS

Result of Consultation for European Patent Application No. 17748998.6, dated Feb. 18, 2022, 5 pages.
Advisory Action for U.S. Appl. No. 16/118,779, dated Sep. 23, 2021, 3 pages.
Notice of Allowance for U.S. Appl. No. 16/118,779, dated Oct. 27, 2021, 8 pages.
Notice of Allowance for U.S. Appl. No. 16/545,357, dated Sep. 27, 2021, 8 pages.
Summons to Attend Oral Proceedings for European Patent Application No. 17748998.6, dated Oct. 6, 2021, 10 pages.
Decision of Reexamination for Chinese Patent Application No. 201780058518.2, dated Apr. 7, 2023, 39 pages.
Notice of Reason for Rejection for Japanese Patent Application No. 2021-516523, dated Feb. 2, 2022, 9 pages.
Examination Report for European Patent Application No. 19727151.3, dated Mar. 30, 2022, 5 pages.
Examination Report for European Patent Application No. 19727151.3, dated Apr. 21, 2023, 4 pages.
Notice of Reasons for Refusal for Japanese Patent Application No. 2021-516523, dated Feb. 28, 2023, 8 pages.
Written Decision on Registration for Korean Patent Application No. 10-2020-7037027, dated Jan. 19, 2023, 7 pages.
Examination Report for European Patent Application No. 19727152.1, dated Apr. 8, 2022, 6 pages.
Decision of Rejection for Chinese Patent Application No. 2017800585182, dated Apr. 6, 2022, 13 pages.
Intention to Grant for European Patent Application No. 17748998.6, dated Mar. 23, 2022, 9 pages.
Advisory Action and Applicant-Initiated Interview Summary for U.S. Appl. No. 16/118,762, dated Mar. 22, 2021, 5 pages.
Notice of Allowance for U.S. Appl. No. 16/118,762, dated Apr. 16, 2021, 8 pages.
Final Office Action for U.S. Appl. No. 16/118,779, dated Jul. 15, 2021, 25 pages.
Non-Final Office Action for U.S. Appl. No. 16/545,357, dated Mar. 15, 2021, 28 pages.
Notice of Allowance for U.S. Appl. No. 16/453,447, dated May 14, 2021, 9 pages.
Corrected Notice of Allowability for U.S. Appl. No. 16/453,447, dated Jun. 23, 2021, 6 pages.
First Office Action for Chinese Patent Application No. 2017800585182, dated Jan. 27, 2021, 15 pages.
Nichia Corporation, "NC3W321AT: Specifications for White LED," Nichia STS-DA1-4281A <Cat.No. 160603>, [online], [retrieved on May 21, 2018] Retrieved from Nichia Corporation using Internet <URL: http://www.nichia.co.jp/en/product/led.html>, 16 pages.
Nichia Corporation, "NC2W321AT: Specifications for White LED," Nichia STS-DA1-4323A <Cat.No.160711>, [online], [retrieved on May 21, 2018] Retrieved from Nichia Corporation using Internet <URL: http://www.nichia.co.jp/en/product/led.html>, 16 pages.
Nichia Corporation, "NC4W321AT: Specifications for White LED," Nichia STS-DA1-4325A <Cat.No. 160711>, [online], [retrieved on May 21, 2018] Retrieved from Nichia Corporation using Internet <URL: http://www.nichia.co.jp/en/product/led.html>, 16 pages.
International Search Report and Written Opinion for International Patent Application No. PCT/US2017/043316, dated Sep. 1, 2017, 13 pages.
Non-Final Office Action for U.S. Appl. No. 15/657,027, dated Apr. 10, 2018, 11 pages.
Final Office Action for U.S. Appl. No. 15/657,027, dated Oct. 19, 2018, 17 pages.
Notice of Allowance for U.S. Appl. No. 15/657,027, dated Dec. 28, 2018, 9 pages.
International Preliminary Report on Patentability for International Patent Application No. PCT/US2017/043316, dated Feb. 7, 2019, 9 pages.
Invitation to Pay Additional Fees and Partial International Search for International Patent Application No. PCT/US2019/028704, dated Jul. 17, 2019, 14 pages.
Invitation to Pay Additional Fees and Partial International Search for International Patent Application No. PCT/US2019/028708, dated Jul. 17, 2019, 17 pages.
Non-Final Office Action for U.S. Appl. No. 16/380,400, dated Sep. 9, 2019, 13 pages.
Dupont, "DuPont™ Ti-Pure® titanium dioxide: Titanium Dioxide for Coatings," Product Brochure H-65969-2, Jun. 2007, 28 pages.
Non-Final Office Action for U.S. Appl. No. 16/118,747, dated Jan. 29, 2020, 28 pages.
International Search Report and Written Opinion for International Patent Application No. PCT/US2019/028704, dated Sep. 9, 2019, 18 pages.
Non-Final Office Action for U.S. Appl. No. 16/118,762, dated Oct. 1, 2019, 36 pages.
Final Office Action for U.S. Appl. No. 16/118,762, dated Feb. 14, 2020, 44 pages.
Advisory Action, Applicant-Initiated Interview Summary, and AFCP 2.0 Decision for U.S. Appl. No. 16/118,762, dated Apr. 24, 2020, 9 pages.
Non-Final Office Action for U.S. Appl. No. 16/118,762, dated May 26, 2020, 25 pages.
International Search Report and Written Opinion for International Patent Application No. PCT/US2019/028708, dated Sep. 9, 2019, 20 pages.
Restriction Requirement for U.S. Appl. No. 29/661,900, dated Nov. 25, 2019, 6 pages.
Notice of Allowance for U.S. Appl. No. 29/661,900, dated Apr. 29, 2020, 6 pages.
Non-Final Office Action for U.S. Appl. No. 16,118,779, dated Jan. 10, 2020, 27 pages.
Notice of Allowance for U.S. Appl. No. 16/380,400, dated Nov. 27, 2019, 8 pages.

(56) References Cited

OTHER PUBLICATIONS

Notice of Allowance for U.S. Appl. No. 16/380,400, dated Mar. 17, 2020, 8 pages.
Examination Report for European Patent Application No. 17748998.6, dated Jan. 3, 2020, 7 pages.
Author Unknown, "Black Silicon," Wikipedia [online], <https://web.archive.org/web/20150401161824/http://en.wikipedia.org/wiki/Black_Silicon> Apr. 1, 2015, 1 page.
Final Office Action for U.S. Appl. No. 16/118,747, dated Jun. 9, 2020, 43 pages.
Advisory Action for U.S. Appl. No. 16/118,747, dated Aug. 18, 2020, 3 pages.
Advisory Action and Applicant-Initiated Interview Summary for U.S. Appl. No. 16/118,747, dated Aug. 24, 2020, 5 pages.
Non-Final Office Action for U.S. Appl. No. 16/118,747, dated Sep. 8, 2020, 32 pages.
Notice of Allowance for U.S. Appl. No. 16/118,747, dated Jan. 6, 2021, 8 pages.
International Preliminary Report on Patentability for International Patent Application No. PCT/US2019/028704, dated Dec. 10, 2020, 11 pages.
Final Office Action for U.S. Appl. No. 16/118,762, dated Jan. 4, 2021, 20 pages.
International Preliminary Report on Patentability for International Patent Application No. PCT/US2019/028708, dated Dec. 10, 2020, 12 pages.
Final Office Action for U.S. Appl. No. 16/118,779, dated Jul. 16, 2020, 35 pages.
Advisory Action and Applicant-Initiated Interview Summary for U.S. Appl. No. 16/118,779, dated Nov. 20, 2020, 5 pages.
Non-Final Office Action for U.S. Appl. No. 16/118,779, dated Jan. 22, 2021, 27 pages.
Non-Final Office Action for U.S. Appl. No. 16/545,357, dated Jun. 24, 2020, 33 pages.
Final Office Action for U.S. Appl. No. 16/545,357, dated Dec. 7, 2020, 41 pages.
Advisory Action and Applicant-Initiated Interview Summary for U.S. Appl. No. 16/545,357, dated Mar. 3, 2021, 4 pages.
Non-Final Office Action for U.S. Appl. No. 16/380,400, dated Jul. 27, 2020, 12 pages.
Notice of Allowance for U.S. Appl. No. 16/380,400, dated Oct. 28, 2020, 9 pages.
Non-Final Office Action for U.S. Appl. No. 16/453,447, dated Dec. 22, 2020, 19 pages.
Notice of Allowance for U.S. Appl. No. 16/797,173, dated Jun. 22, 2020, 10 pages.
Notice of Allowance for U.S. Appl. No. 16/797,173, dated Aug. 24, 2020, 9 pages.
Examination Report for European Patent Application No. 17748998.6, dated Jun. 25, 2020, 7 pages.
Examination Report for European Patent Application No. 17748998.6, dated Feb. 4, 2021, 6 pages.
International Search Report and Written Opinion for International Patent Application No. PCT/US2020/038960, dated Aug. 11, 2020, 17 pages.
Notification of Reexamination for Chinese Patent Application No. 2017800585182, dated Dec. 14, 2022, 7 pages.
Notice of Reason for Rejection for Japanese Patent Application No. 2021-516523, dated Aug. 12, 2022, 14 pages.
Notice of Preliminary Rejection for Korean Patent Application No. 10-2020-7037027, dated Aug. 3, 2022, 10 pages.
Non-Final Office Action for U.S. Appl. No. 17/116,576, dated Aug. 10, 2023, 14 pages.
First Office Action for Chinese Patent Application No. 2019800351475, mailed Aug. 22, 2023, 19 pages.
Final Office Action for U.S. Appl. No. 17/116,576, mailed Dec. 8, 2023, 14 pages.
First Office Action for Chinese Patent Application No. 201980035067.X, mailed Aug. 23, 2023, 15 pages.
Notification to Grant for Chinese Patent Application No. 201980035147.5, mailed Feb. 9, 2024, 4 pages.
Notification to Grant for Chinese Patent Application No. 201980035067.X, mailed Feb. 9, 2024, 4 pages.
Non-Final Office Action for U.S. Appl. No. 17/116,576, mailed Mar. 25, 2024, 15 pages.
Notice of Allowance for U.S. Appl. No. 17/116,576, mailed Jul. 5, 2024, 11 pages.

* cited by examiner

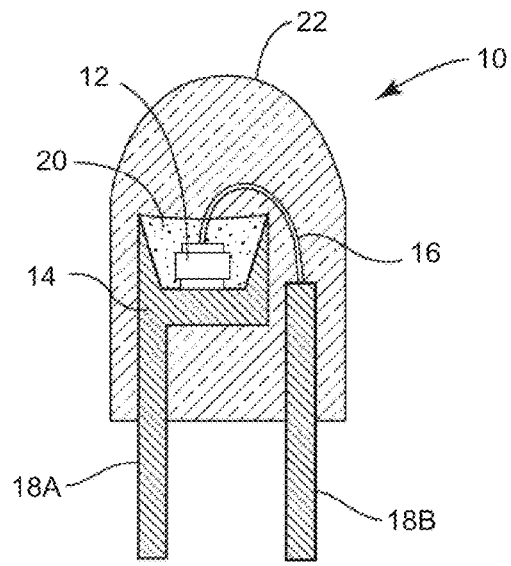
FIG._1
PRIOR ART
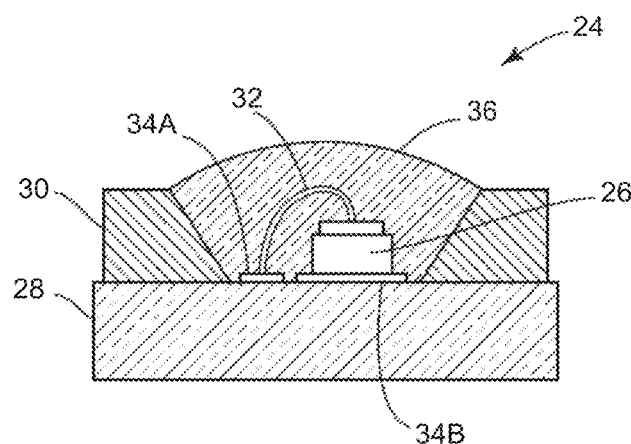
FIG._2
PRIOR ART
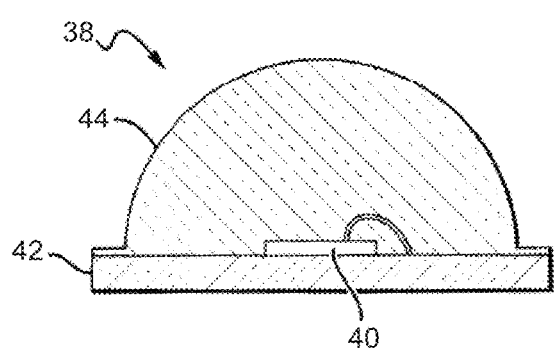
FIG._3
PRIOR ART

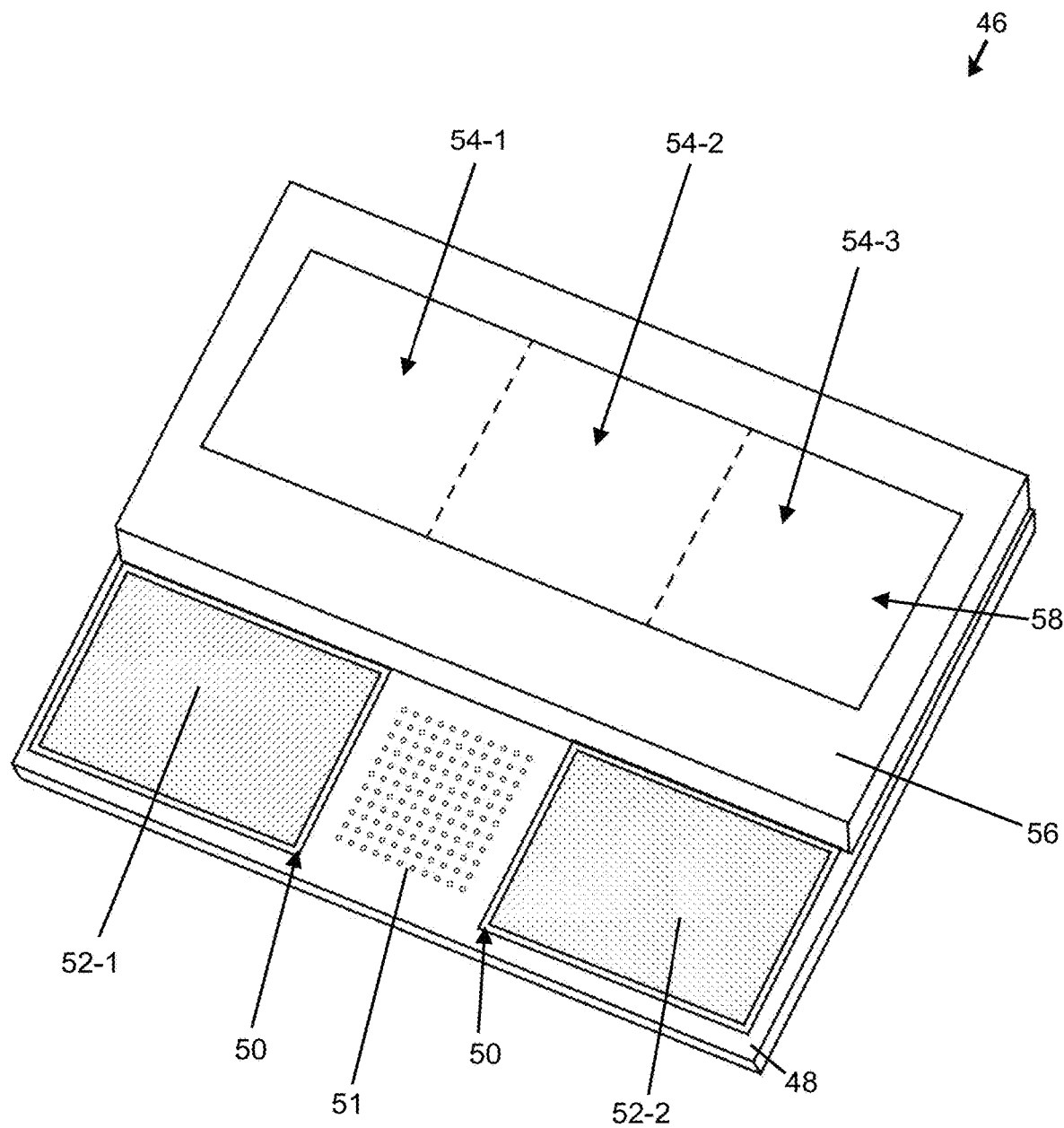
FIG._4

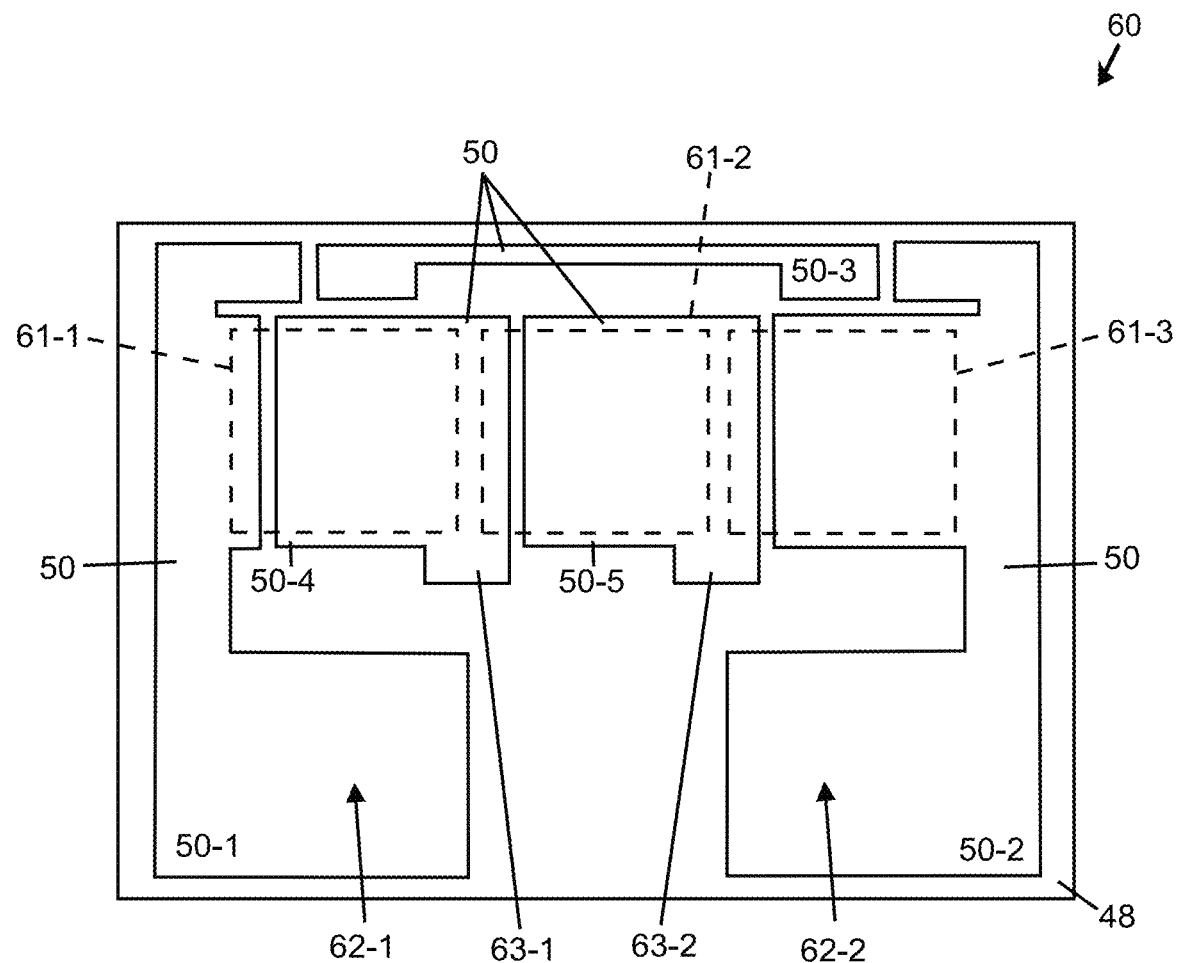
FIG._5A

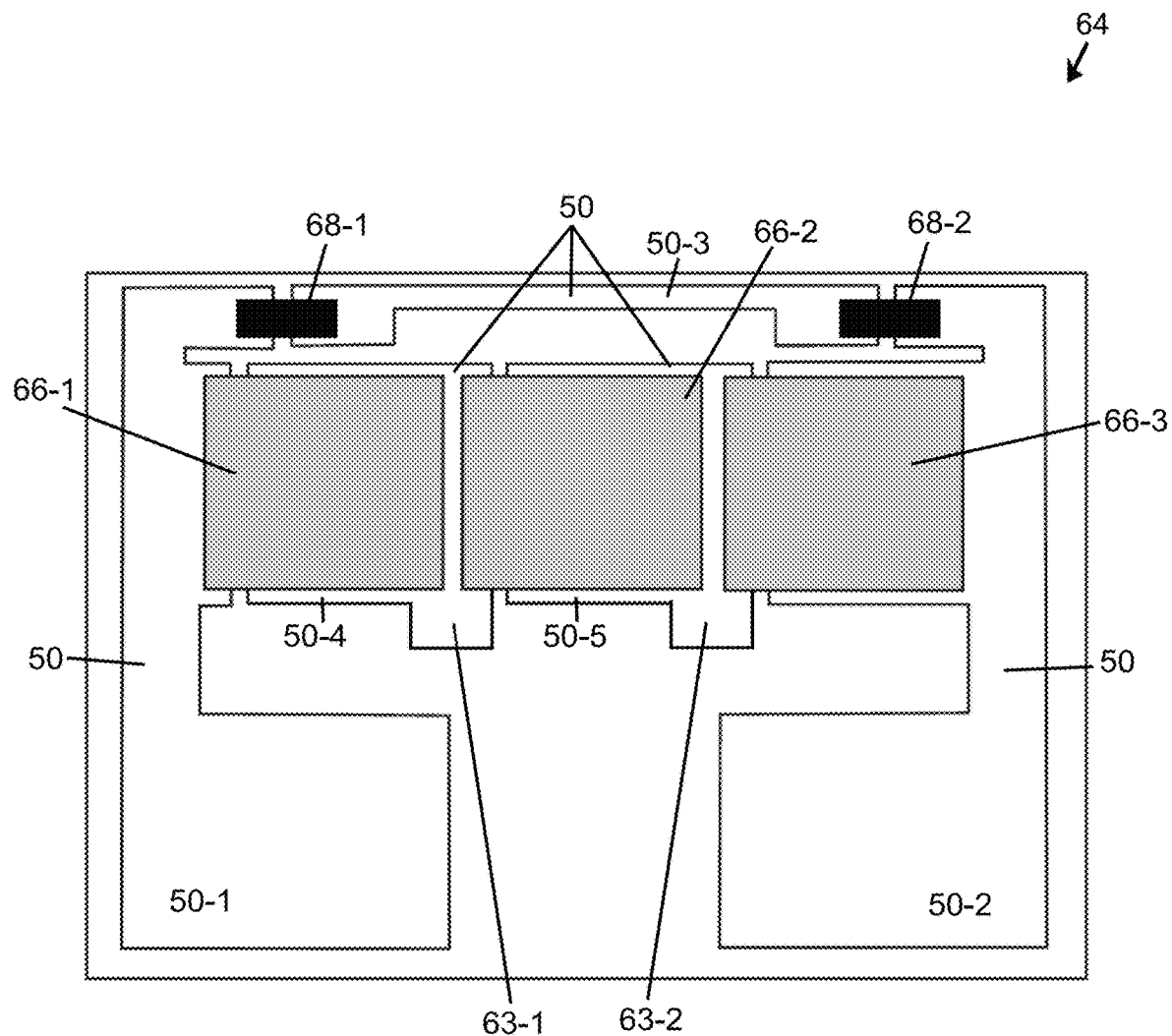
FIG._5B

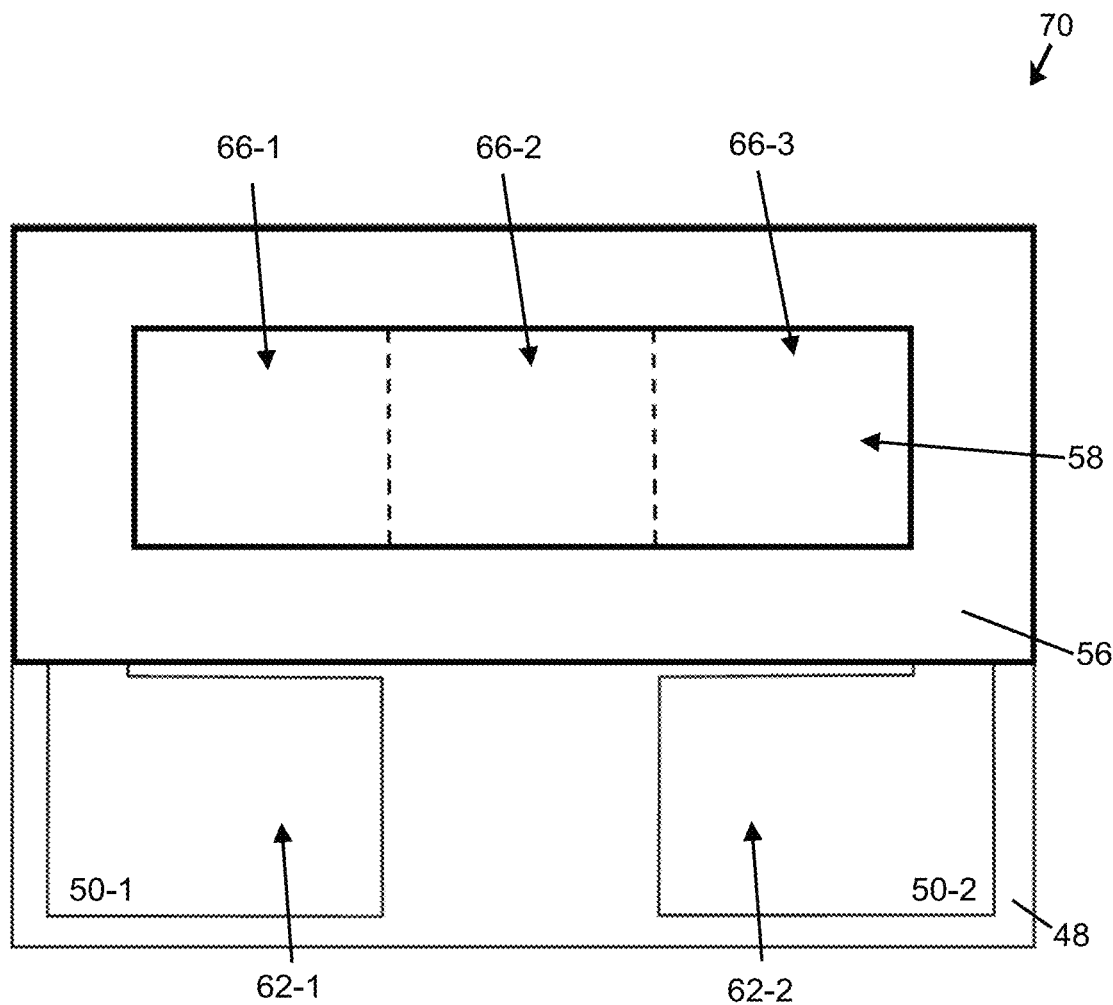
FIG._5C

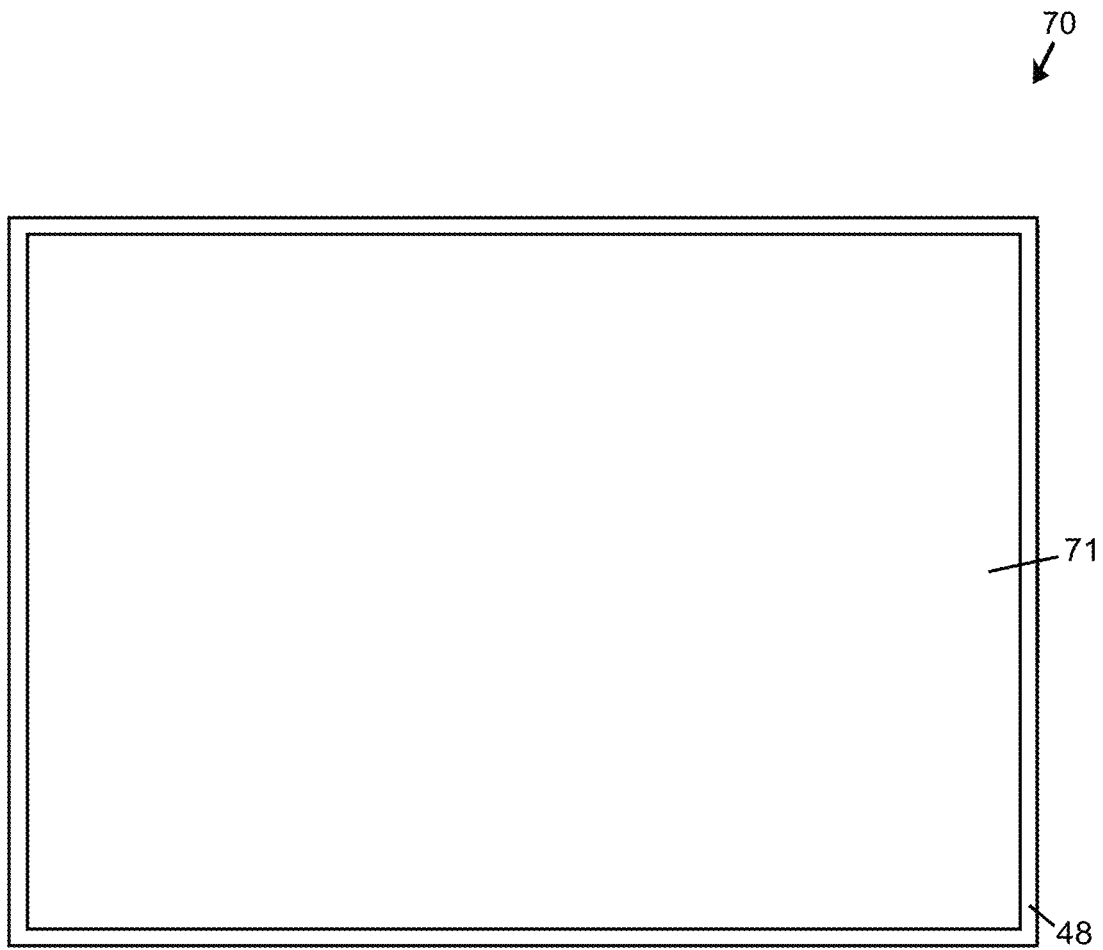
FIG._5D

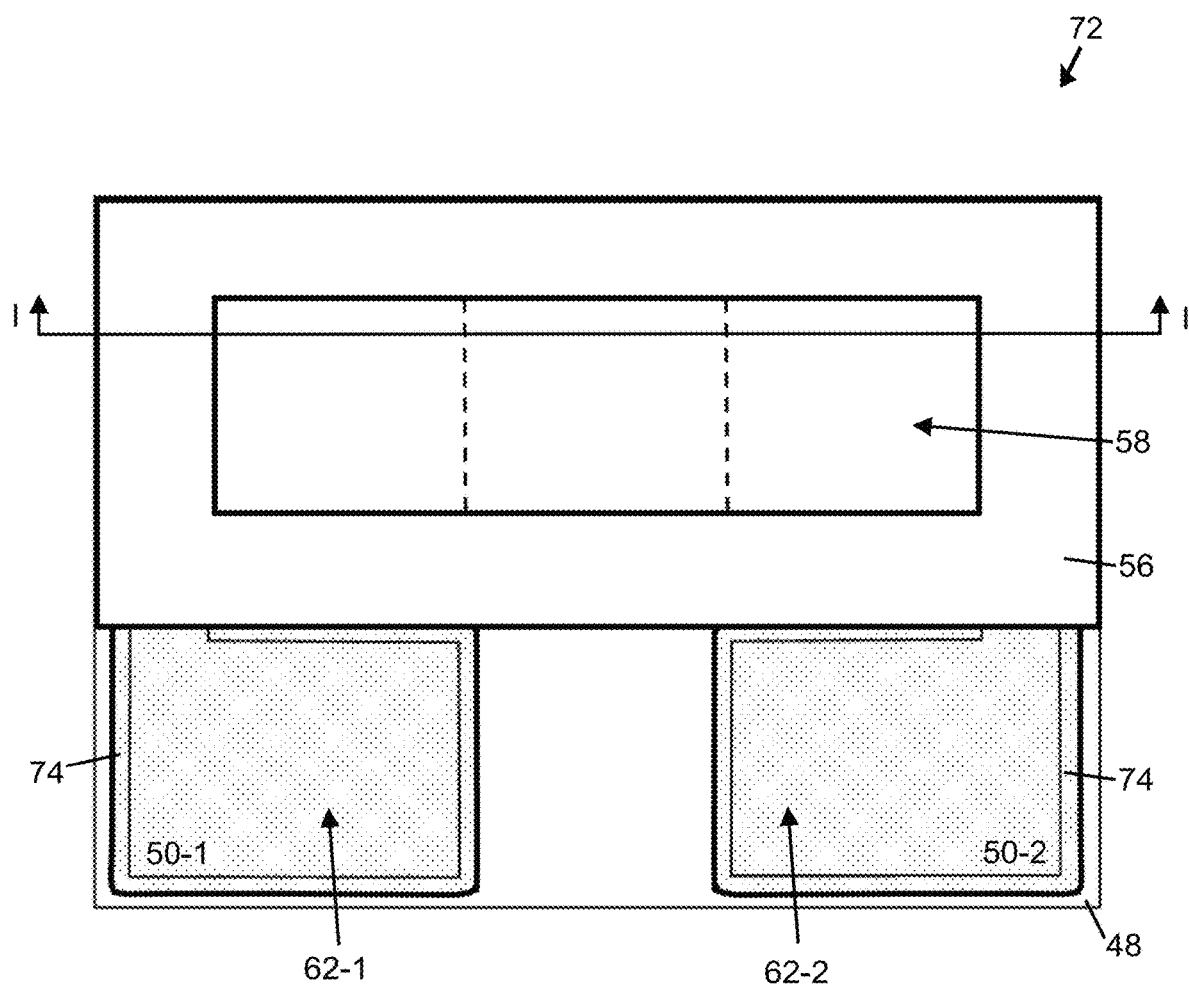
FIG._6A

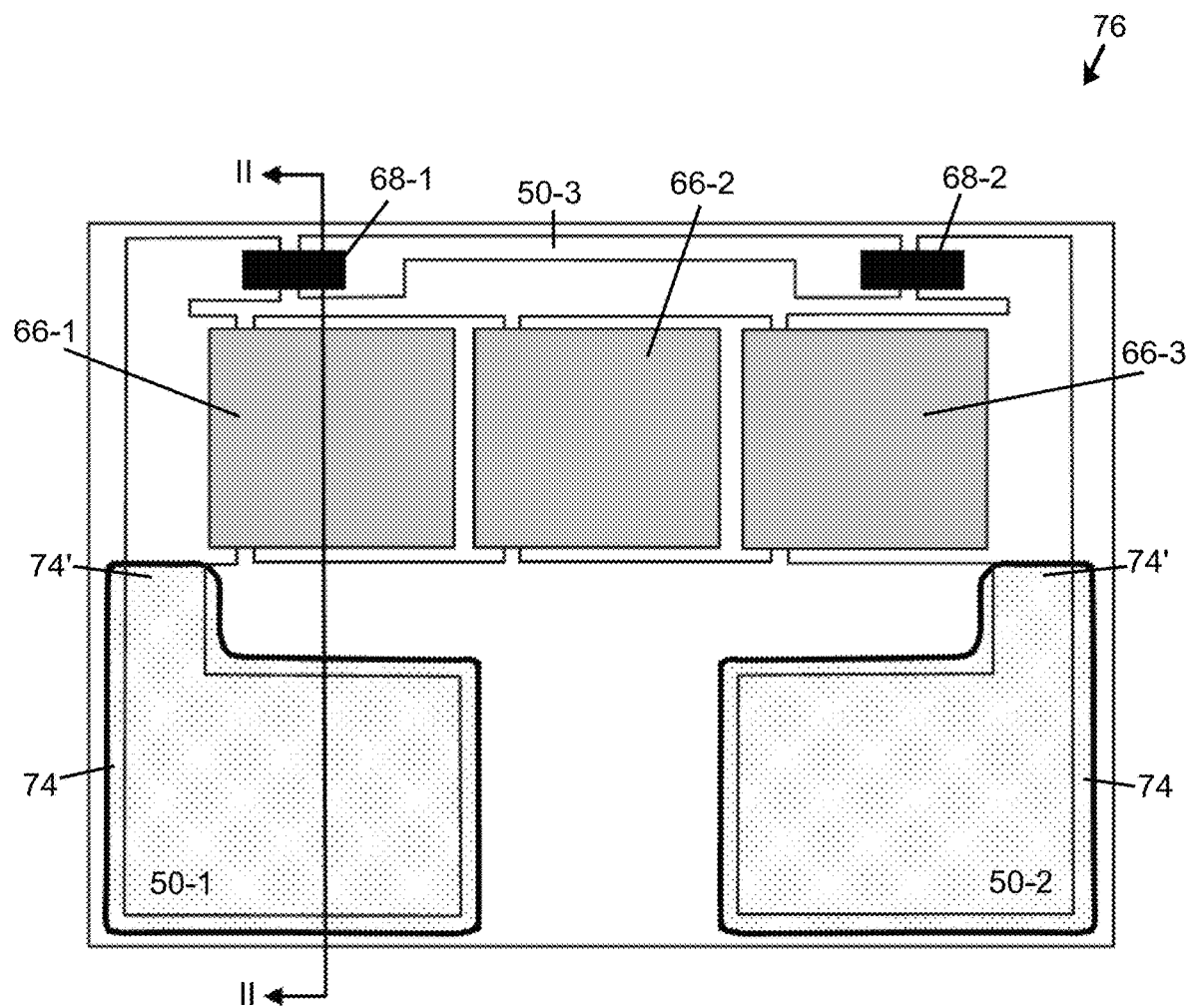
FIG._6B

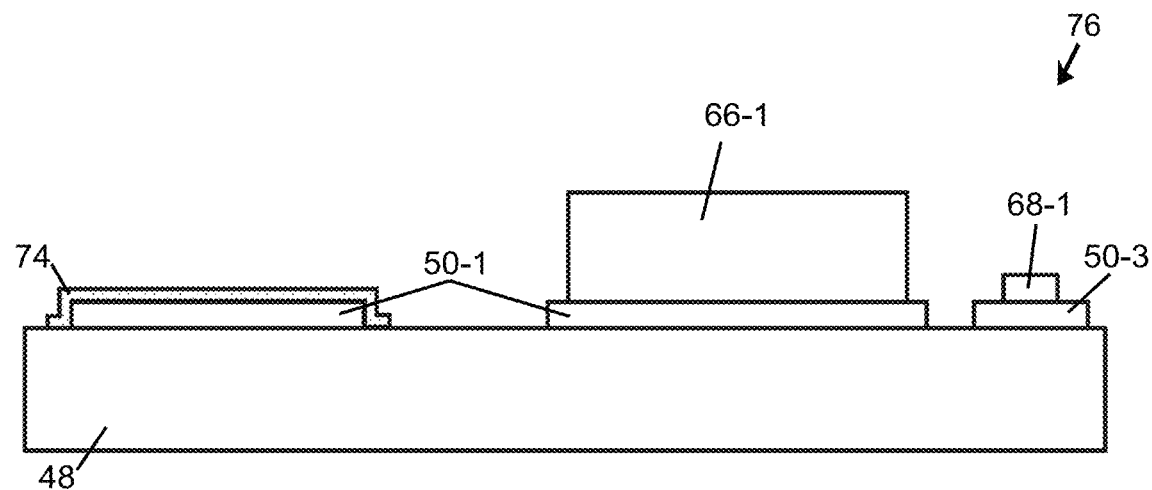
FIG._6C
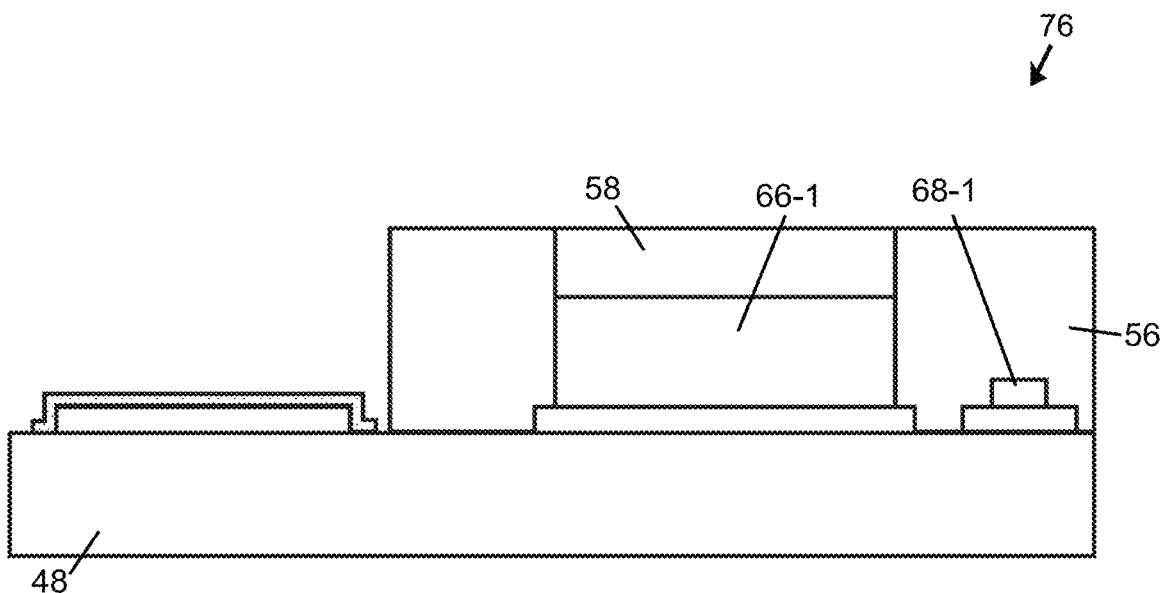
FIG._6D

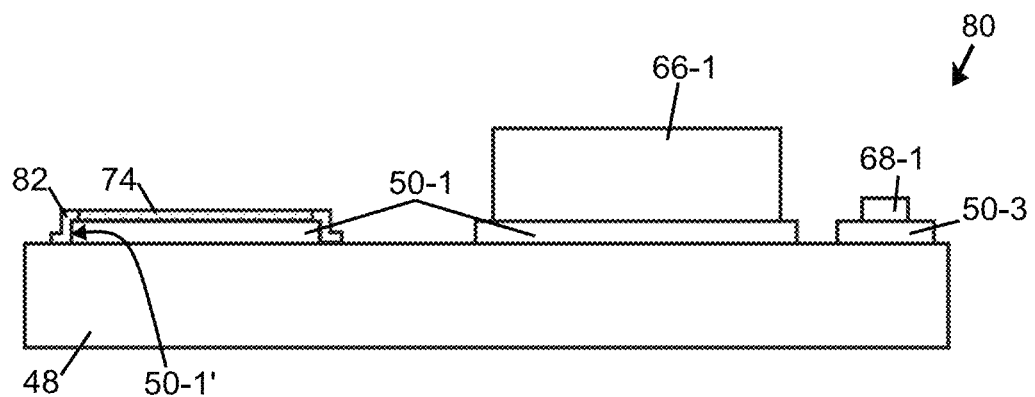
FIG._7A
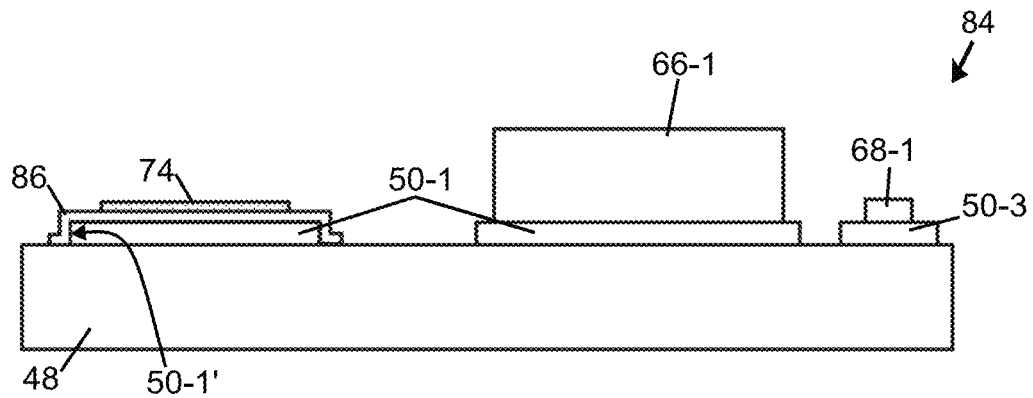
FIG._7B

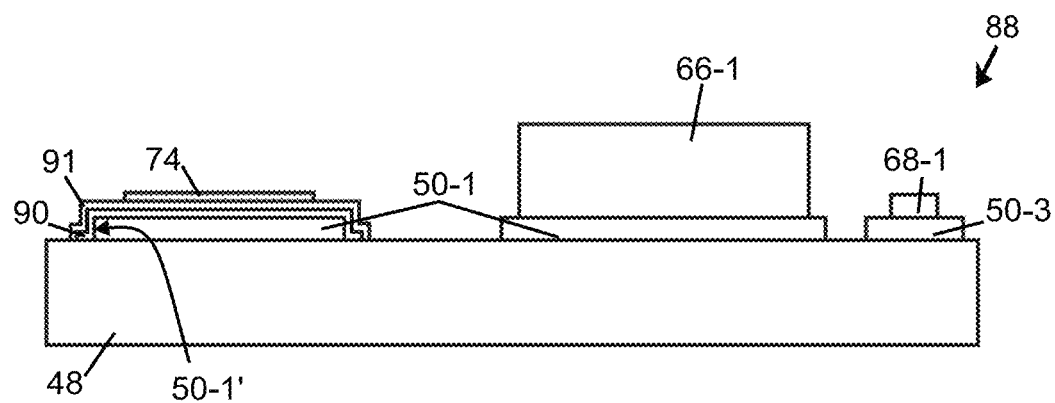
FIG. _7C
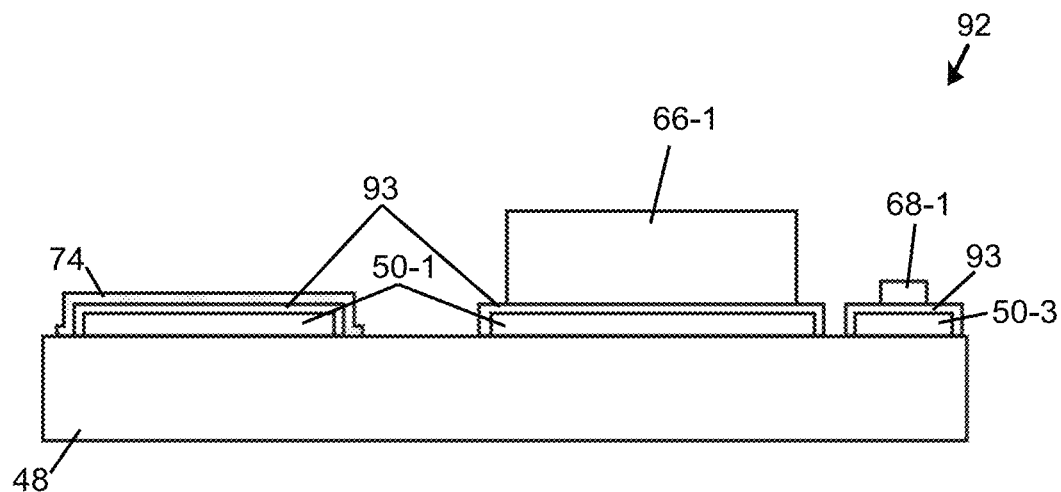
FIG. _7D

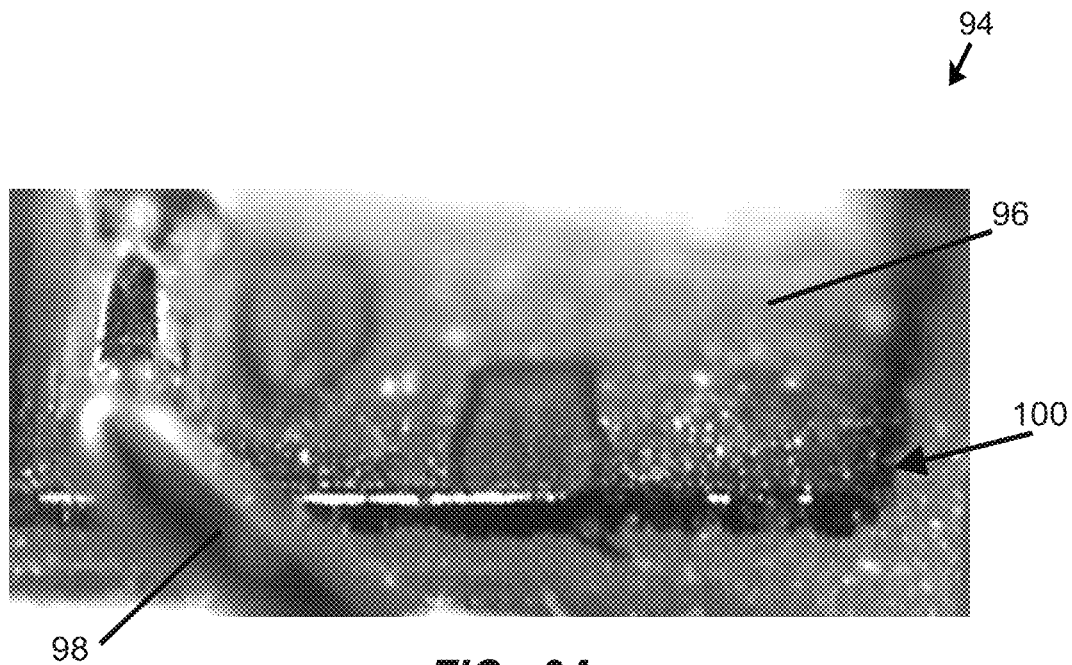
*FIG._8A*
*PRIOR ART*
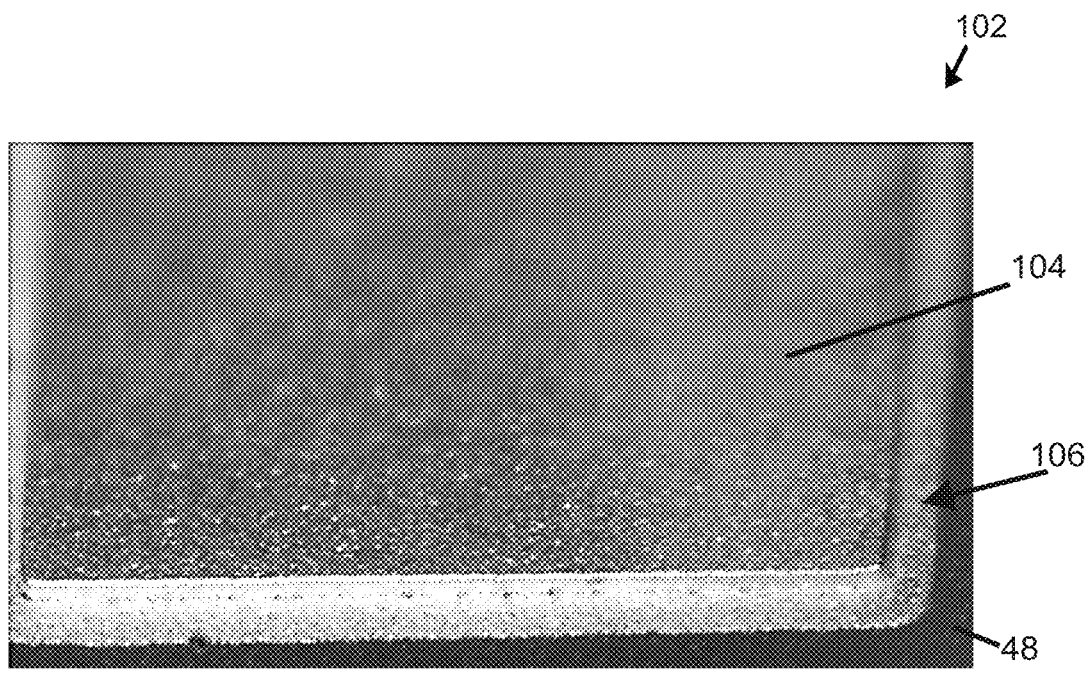
*FIG._8B*

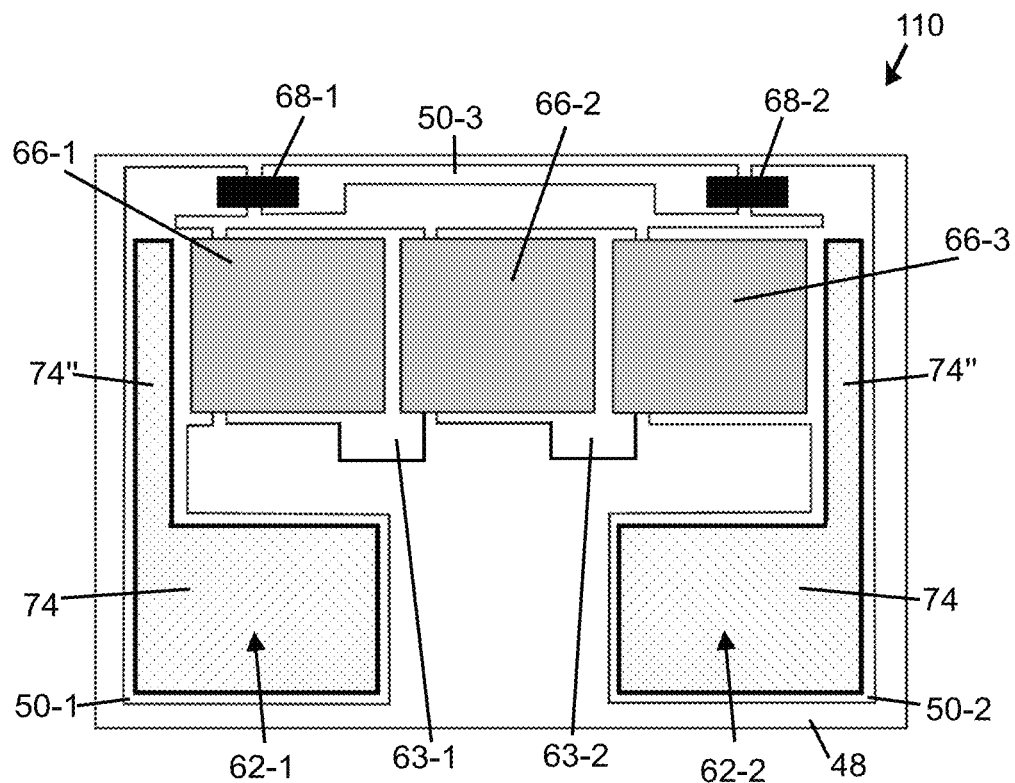
FIG._9
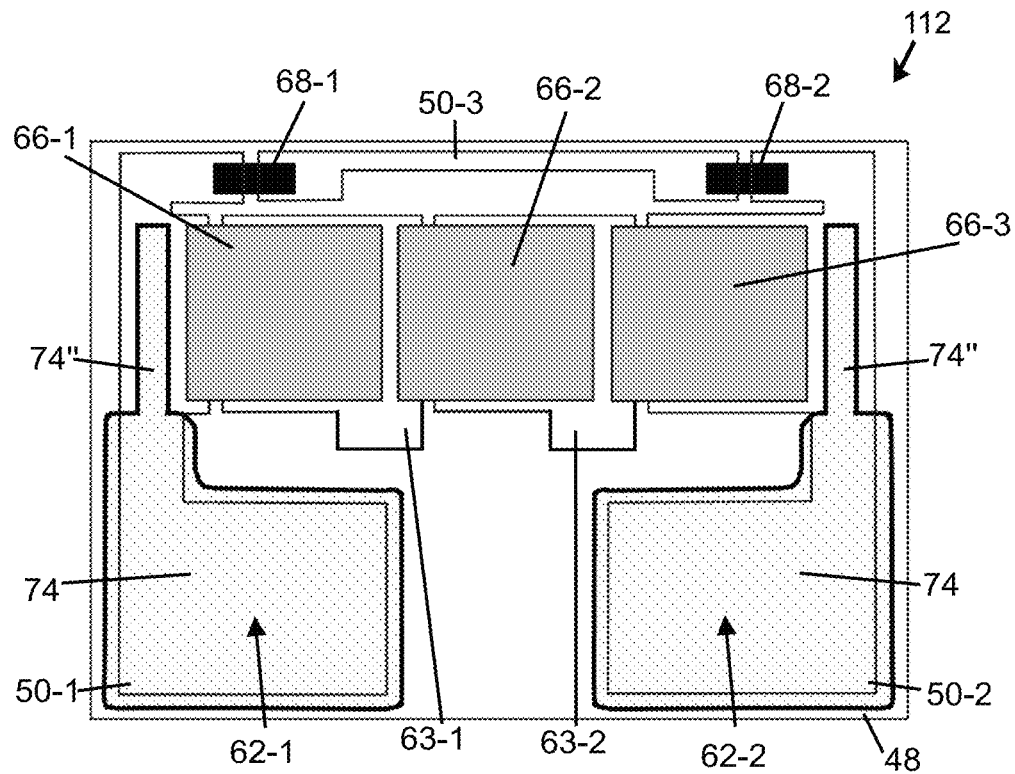
FIG._10

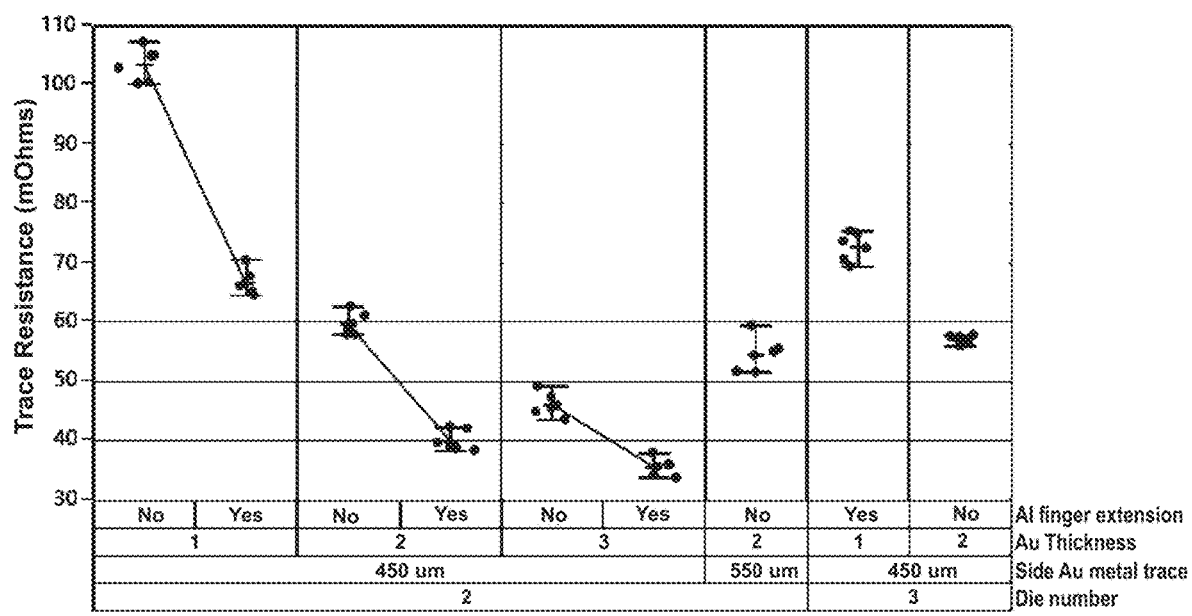
FIG._11A

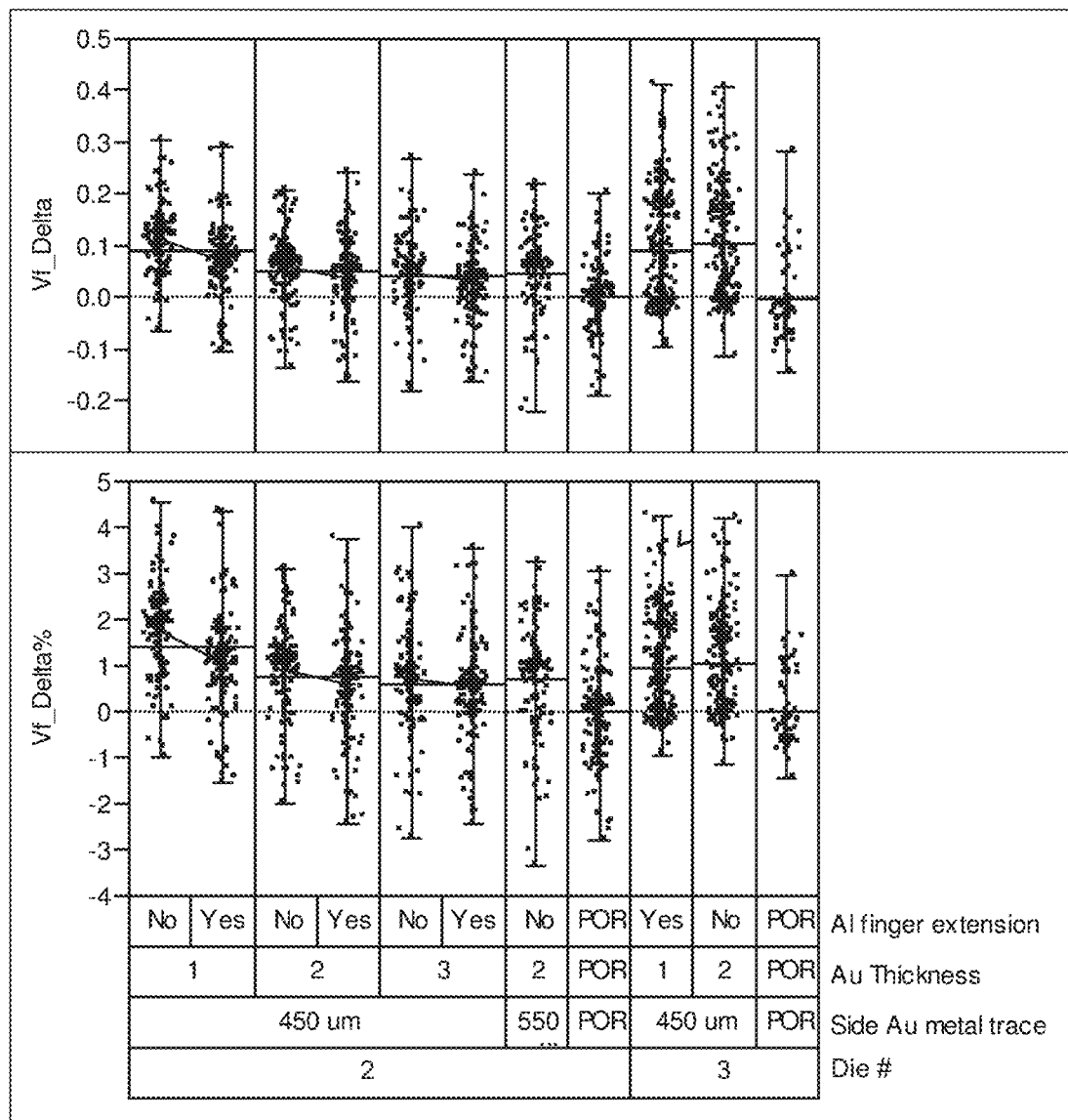
FIG._11B

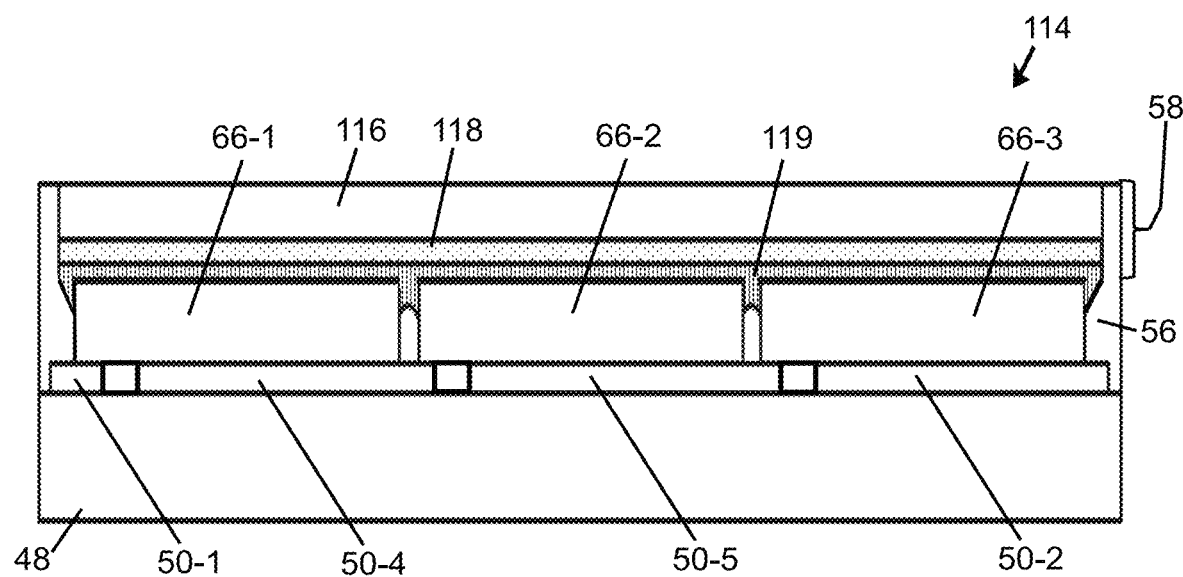
FIG._12A

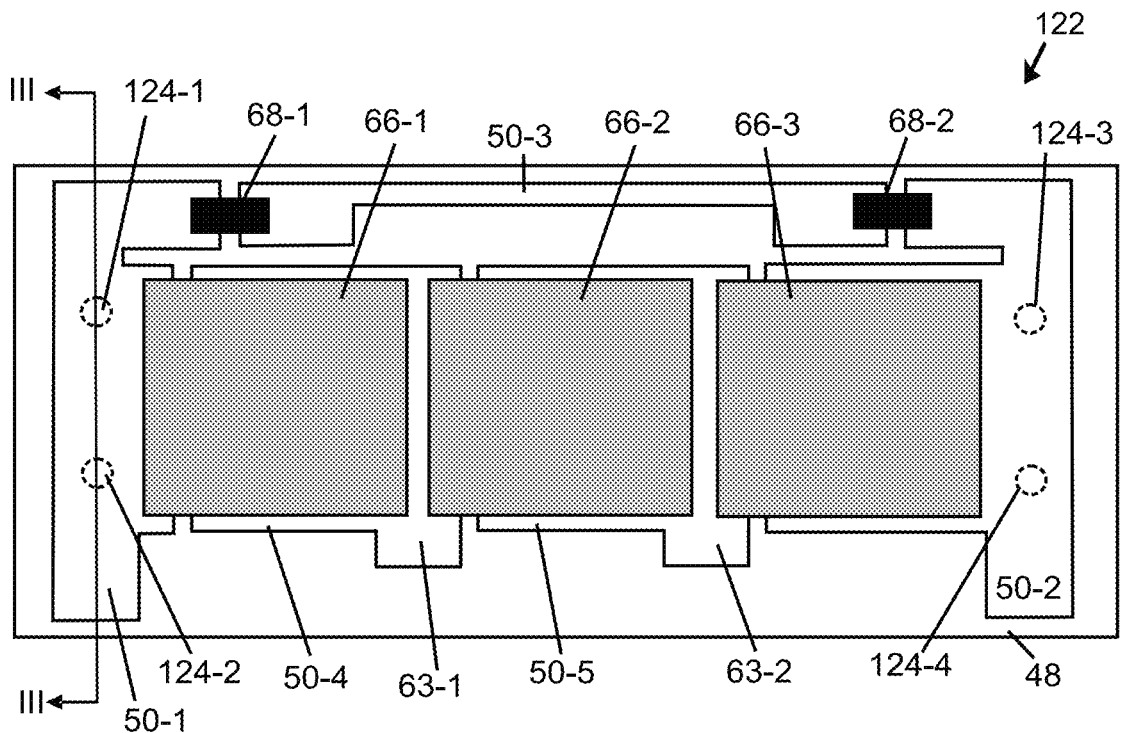
FIG._13A
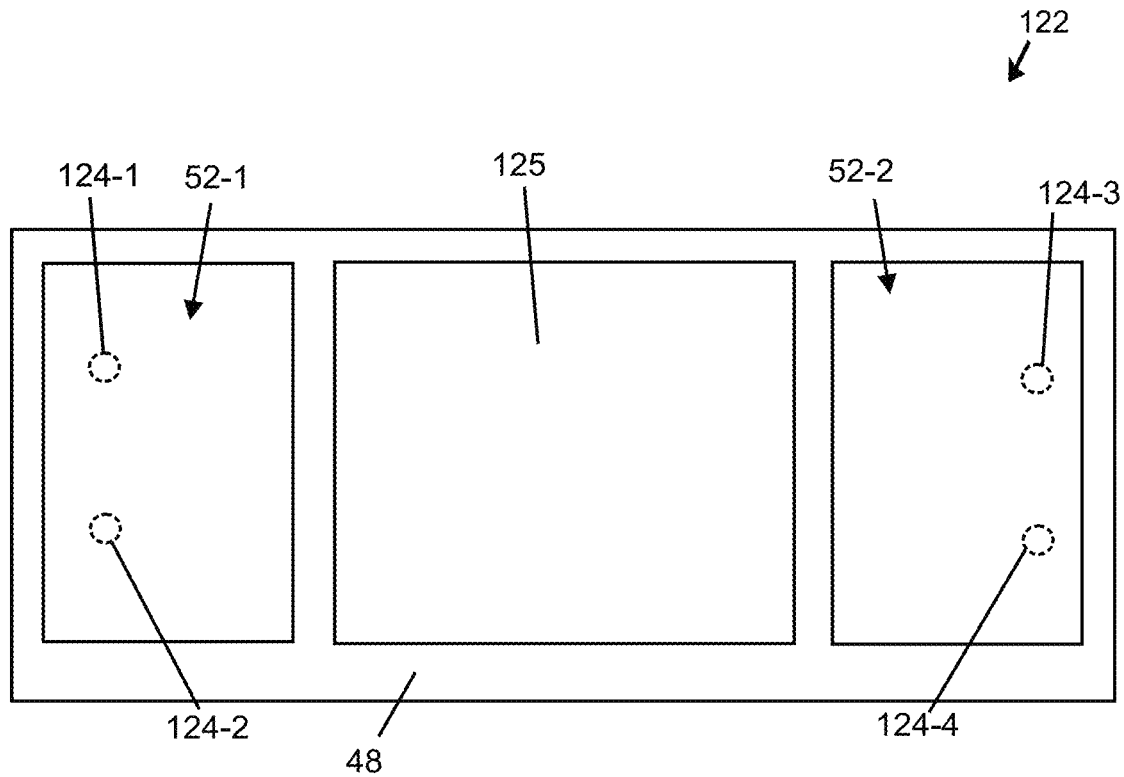
FIG._13B

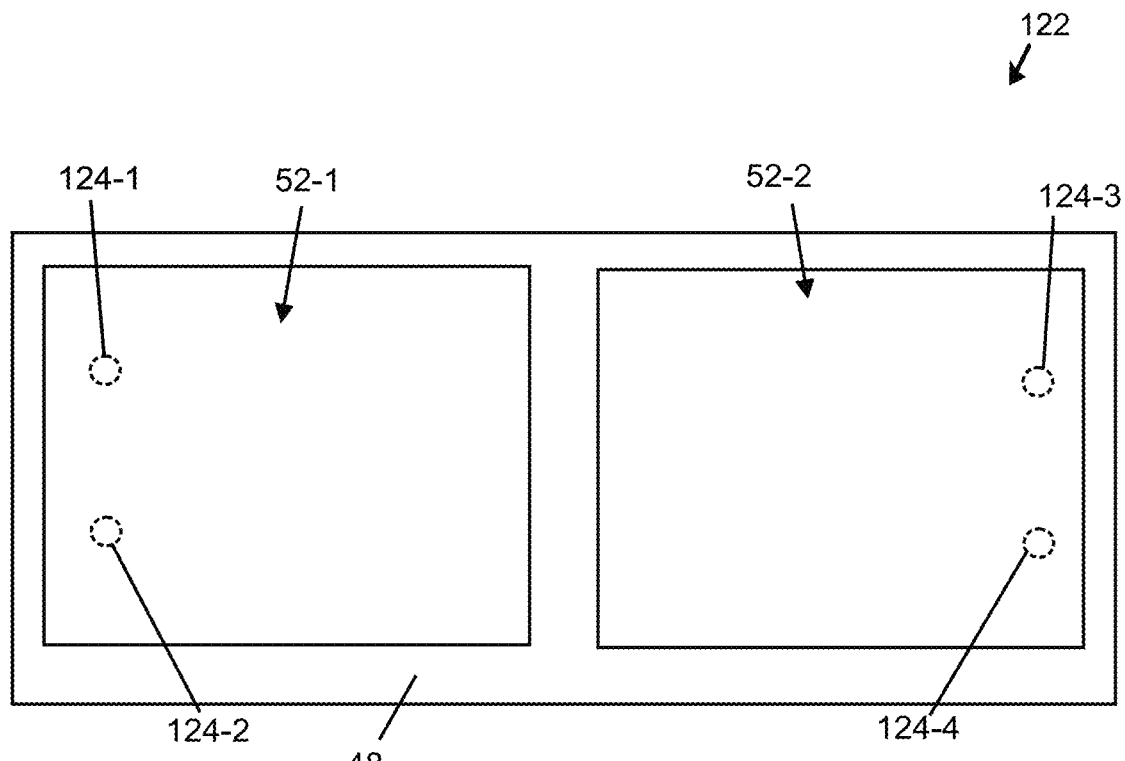
FIG._13C
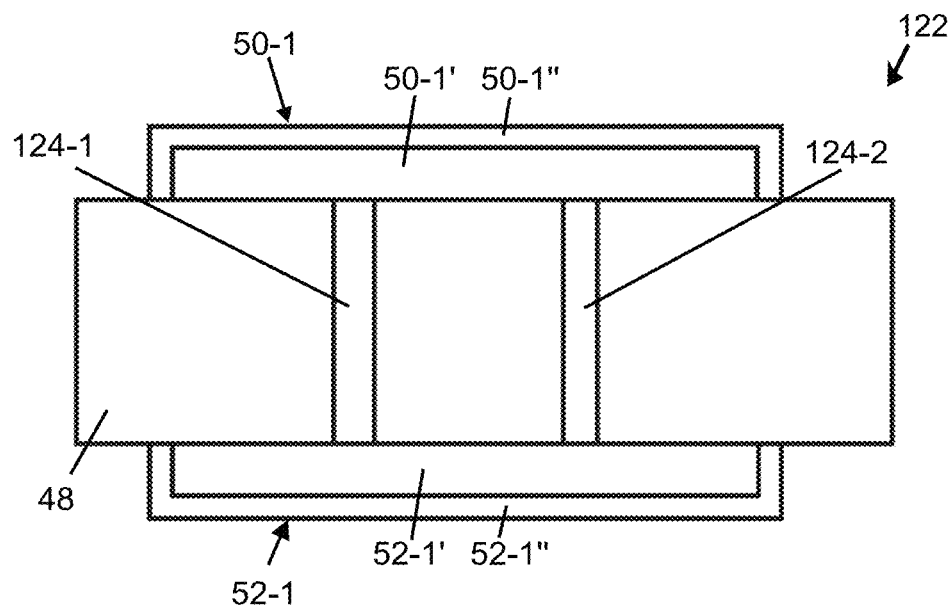
FIG._13D

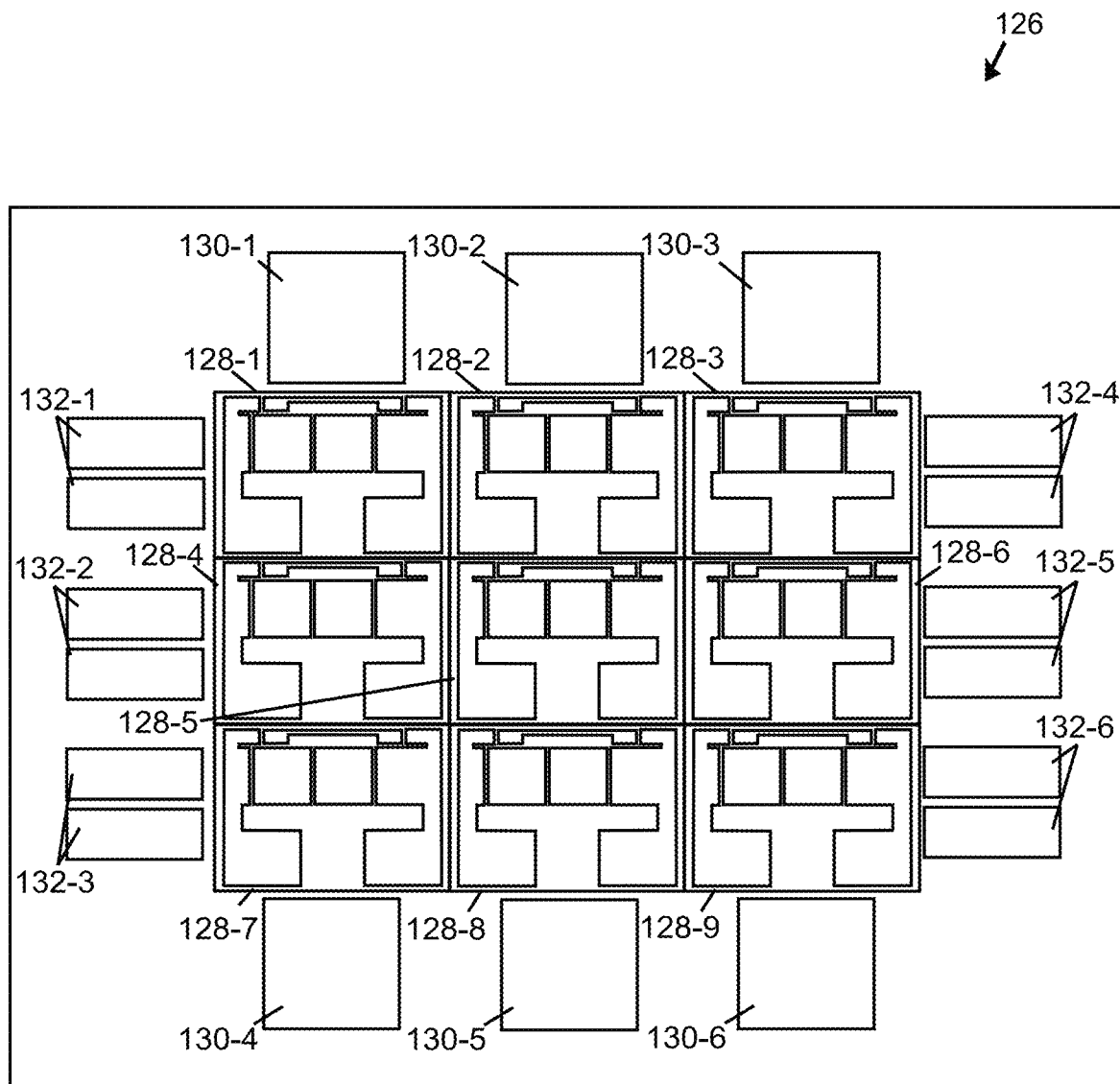
FIG._14

LIGHT-EMITTING DIODE PACKAGES

RELATED APPLICATION

This application is a division of U.S. patent application Ser. No. 16/118,747, filed Aug. 31, 2018, now U.S. Pat. No. 11,024,785, which claims the benefit of provisional patent application Ser. No. 62/676,697, filed May 25, 2018, the disclosures of which are hereby incorporated herein by reference in their entireties.

FIELD OF THE DISCLOSURE

The present disclosure relates to solid-state lighting devices including light-emitting diodes, and more particularly to packaged light-emitting diodes.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

FIG. 1 illustrates a typical LED package 10 including a single LED chip 12 that is mounted on a reflective cup 14 by means of a solder bond or conductive epoxy. One or more wire bonds 16 can connect ohmic contacts of the LED chip 12 to leads 18A and/or 18B, which may be attached to or integral with the reflective cup 14. The reflective cup 14 may be filled with an encapsulant material 20, which may contain a wavelength conversion material such as a phosphor. At least some light emitted by the LED chip 12 at a first wavelength may be absorbed by the phosphor, which may responsively emit light at a second wavelength. The entire assembly is then encapsulated in a clear protective resin 22, which may be molded in the shape of a lens to collimate the light emitted from the LED chip 12. While the reflective cup 14 may direct light in an upward direction, optical losses may occur when the light is reflected. Some light may be absorbed by the reflective cup 14 due to the less than 100% reflectivity of practical reflector surfaces. Some metals can have less than 95% reflectivity in the wavelength range of interest.

FIG. 2 shows another conventional LED package 24 in which one or more LED chips 26 can be mounted onto a carrier such as a printed circuit board (PCB) carrier, substrate, or submount 28. A metal reflector 30 is mounted on the submount 28 and surrounds the LED chips 26 to reflect light emitted by the LED chips 26 away from the LED package 24. The metal reflector 30 also provides mechanical protection to the LED chips 26. One or more wire bond connections 32 are made between ohmic contacts on the LED chips 26 and electrical traces 34A, 34B on the submount 28. The mounted LED chips 26 are then covered with an encapsulant 36, which may provide environmental and mechanical protection to the LED chips 26 while also acting as a lens. The metal reflector 30 is typically attached to the submount 28 by means of a solder or epoxy bond. The metal reflector 30 may also experience optical losses when the light is reflected because it also has less than 100% reflectivity.

FIG. 3 shows another conventional LED package 38 in which an LED chip 40 can be mounted on a submount 42 with a hemispheric lens 44 formed over it. The LED chip 40 can be coated by a conversion material that can convert all or most of the light from the LED chip 40. The hemispheric lens 44 is arranged to reduce total internal reflection of light. The lens 44 is made relatively large compared to the LED chip 40 so that the LED chip 40 approximates a point light source under the lens 44. As a result, an increased amount of LED light that reaches the surface of the lens 44 emits from the lens 44 on a first pass. Additionally, the lens 44 can be useful for directing light emission from the LED chip 40 in a desired emission pattern for the LED package 38.

The art continues to seek improved light-emitting diodes and solid-state lighting devices having reduced optical losses and providing desirable illumination characteristics capable of overcoming challenges associated with conventional lighting devices.

SUMMARY

The present disclosure relates in various aspects to solid-state light emitting devices including light-emitting diodes (LEDs), and more particularly to packaged LEDs. In some embodiments, an LED package includes electrical connections that are configured to reduce corrosion of metals within the package; or decrease the overall forward voltage of the LED package; or provide an electrical path for serially-connected electrostatic discharge (ESD) chips. In some embodiments, an LED package includes at least two LED chips and a material between the two LED chips that promotes homogeneity of composite emissions from the two LED chips. In this manner, LED packages according to the present disclosure may be beneficial for various applications, including those where a high luminous intensity is desired in a variety of environmental conditions. Such applications include automotive lighting, aerospace lighting, and general illumination.

In some aspects, an LED package comprises: a submount; a metal pattern on the submount, wherein the metal pattern comprises: at least one die attach pad; and at least one bond pad. The LED package additionally comprises at least one LED chip mounted on the at least one die attach pad; and a bond metal on the at least one bond pad and on a surface of the submount that is adjacent at least one bond pad. In some embodiments, the LED package further comprises a light-altering material arranged around a perimeter of the at least one LED chip on the surface of the submount. In some embodiments, the light-altering material covers a portion of the bond metal on the surface of the submount. In some embodiments, the light-altering material comprises a light-reflective material. In some embodiments, the light-reflective material comprises fused silica, fumed silica, or titanium dioxide ($TiO_2$) particles suspended in silicone. In some embodiments, the LED package further comprises a wavelength conversion element on the at least one LED chip.

In some aspects, an LED package comprises: a submount; a metal pattern on the submount, wherein the metal pattern comprises: a die attach pad; a bond pad; and the LED package additionally comprises a metal trace that is continuous with at least a portion of the die attach pad and the bond pad; an LED chip mounted on the die attach pad; and a bond metal on the bond pad, wherein the bond metal comprises a conductive finger that extends on the metal trace adjacent the LED chip. In some embodiments, the bond metal is on a surface of the submount that is adjacent the bond pad. In some embodiments, the LED package further comprises a light-altering material arranged around a perimeter of the LED chip on the surface of the submount. In some embodiments, the light-altering material covers at least a portion of the conductive finger. In some embodiments, the light-altering material comprises a light-reflective material. In some embodiments, the light-reflective material comprises fused silica, fumed silica, or titanium dioxide ($TiO_2$) particles suspended in silicone. In some embodiments, the LED package further comprises a wavelength conversion element on the LED chip.

In some aspects, an LED package comprises: a submount; a metal pattern on the submount, wherein the metal pattern comprises: at least one die attach pad; and at least one bond pad; and the LED package additionally comprises at least one LED chip mounted on the at least one die attach pad; a bond metal on a top surface of the at least one bond pad; and a corrosion-reducing layer on a sidewall of the at least one bond pad and a surface of the submount that is adjacent the at least one bond pad.

In some aspects, an LED package comprises: a submount; a plurality of LED chips on the submount; a clear material at least partially between each LED chip of the plurality of LED chips; and a wavelength conversion element on the plurality of LED chips. In some embodiments, the clear material is also arranged between the wavelength conversion element and the plurality of LED chips. In some embodiments, the wavelength conversion element comprises a lumiphoric material on a superstrate. In some embodiments, the lumiphoric material is between the superstrate and the clear material.

In some aspects, a LED package comprises: a submount; a first metal trace on a surface of the submount; a second metal trace on the surface of the submount; a first LED chip electrically connected to the first metal trace and the second metal trace; a first ESD chip electrically connected to the first metal trace; a second ESD chip electrically connected to the second metal trace; and a third metal trace serially connected between the first ESD chip and the second ESD chip. In some embodiments, the LED package further comprises a second LED chip serially connected with the first LED chip between the first metal trace and the second metal trace. In some embodiments, the first ESD chip and the second ESD chip are arranged in parallel with the first LED chip and the second LED chip between the first metal trace and the second metal trace. In some embodiments, the LED package further comprises a light-altering material arranged around a perimeter of the first LED chip on the surface of the submount. In some embodiments, the light-altering material covers the first ESD chip and the second ESD chip on the surface of the submount. In some embodiments, the light-altering material comprises a light-reflective material. In some embodiments, the light-reflective material comprises fused silica, fumed silica, or titanium dioxide ($TiO_2$) particles suspended in silicone. In some embodiments, an anode of the first LED chip is flip-chip mounted to the first metal trace and a cathode of the second LED chip is flip-chip mounted to the second metal trace. In some embodiments, a cathode of the first LED chip is flip-chip mounted to a fourth metal trace and an anode of the second LED chip is flip-chip mounted to a fifth metal trace. In some embodiments, the LED package further comprises a third LED chip wherein an anode of the third LED chip is flip-chip mounted to the fourth metal trace and a cathode of the third LED chip is flip-chip mounted to the fifth metal trace.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a cross-sectional representation of a conventional light-emitting diode (LED) package.

FIG. 2 illustrates a cross-sectional representation of a conventional LED package.

FIG. 3 illustrates a cross-sectional representation of a conventional LED package.

FIG. 4 is a perspective view of an LED package according to some embodiments.

FIG. 5A illustrates a top view of an LED package according to some embodiments.

FIG. 5B illustrates a top view of an LED package according to some embodiments.

FIG. 5C illustrates a top view of an LED package according to some embodiments.

FIG. 5D illustrates a bottom view of the LED package of FIG. 5C according to some embodiments.

FIG. 6A illustrates a top view of an LED package according to some embodiments.

FIG. 6B illustrates a top view of an LED package according to some embodiments.

FIG. 6C is a side view illustration representing a cross-section taken along section line II-II of the LED package of FIG. 6B.

FIG. 6D illustrates a cross-sectional view of the LED package of FIG. 6C with the addition of a light-altering material and a wavelength conversion element.

FIG. 7A illustrates a cross-sectional view of an LED package similar to the LED package of FIG. 6C.

FIG. 7B illustrates a cross-sectional view of an LED package similar to the LED package of FIG. 7A.

FIG. 7C illustrates a cross-sectional view of an LED package similar to the LED package of FIG. 7A.

FIG. 7D illustrates a cross-sectional view of an LED package similar to the LED package of FIG. 6C.

FIG. 8A is a photograph of a portion of a conventional LED package after exposure to corrosion testing.

FIG. 8B is a photograph of a portion of an LED package according to some embodiments after exposure to corrosion testing.

FIG. 9 illustrates a top view of an LED package according to some embodiments.

FIG. 10 illustrates a top view of an LED package according to some embodiments.

FIG. 11A is a plot comparing electrical performance of LED packages with and without conductive fingers of a bond metal according to some embodiments.

FIG. 11B is a plot comparing electrical performance of LED packages after die attach for LED packages with and without conductive fingers of a bond metal according to some embodiments.

FIG. 12A illustrates a cross-sectional view of an LED package according to some embodiments.

FIG. 13A illustrates a top view of an LED package according to some embodiments.

FIG. 13B illustrates a bottom view of an LED package according to some embodiments.

FIG. 13C illustrates a bottom view of an LED package according to some embodiments.

FIG. 13D is a side view illustration representing a cross-section of the LED package taken along section line III-III of FIG. 13A.

FIG. 14 illustrates a top view of a panel from an intermediate step of manufacturing according to some embodiments.

DETAILED DESCRIPTION

Figure 12B:
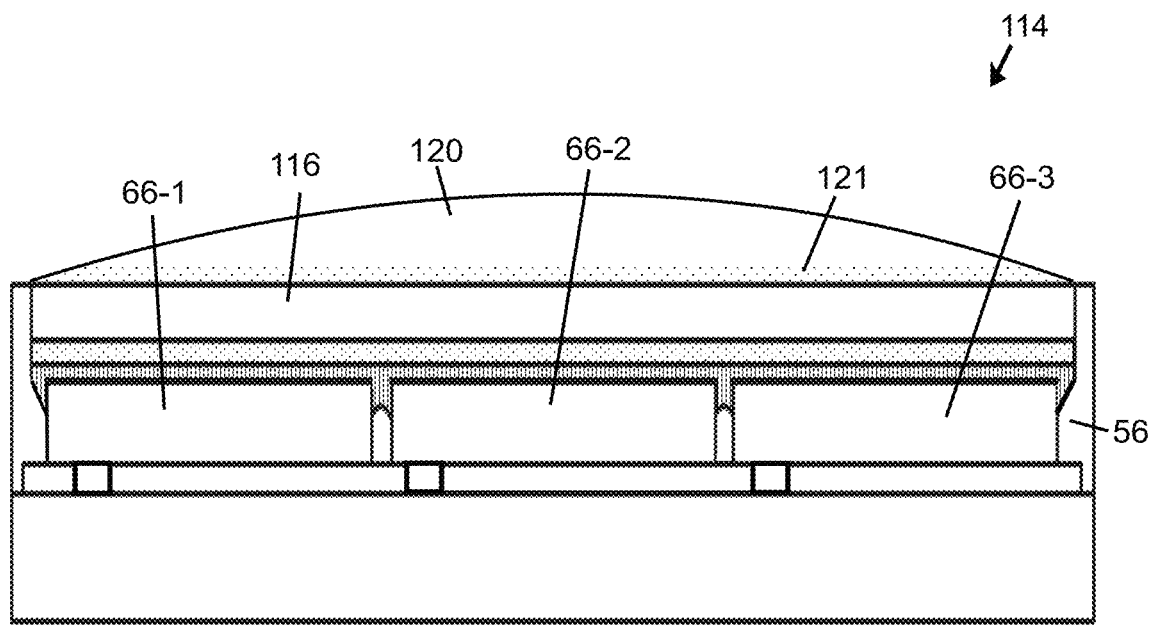
FIG. 12B illustrates a cross-sectional view of the LED package of FIG. 12A with a lens according to some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates in various aspects to solid-state light emitting devices including light-emitting diodes (LEDs), and more particularly to packaged LEDs. In some embodiments, an LED package includes electrical connections that are configured to reduce corrosion of metals within the package; or decrease the overall forward voltage of the LED package; or provide an electrical path for serially-connected electrostatic discharge (ESD) chips. In some embodiments, an LED package includes at least two LED chips and a material between the two LED chips that promotes homogeneity of composite emissions from the two LED chips. In this manner, LED packages according to the present disclosure may be beneficial for various applications, including those where a high luminous intensity is desired in a variety of environmental conditions. Such applications include automotive lighting, aerospace lighting, and general illumination.

An LED chip typically comprises an active LED structure or region that can have many different semiconductor layers arranged in different ways. The fabrication and operation of LEDs and their active structure are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to: buffer layers, nucleation layers, super lattice structures, un-doped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits a blue light in a peak wavelength range of approximately 430 nanometers (nm) to 480 nm. In other embodiments, the active LED structure emits green light in a peak wavelength range of 500 nm to 570 nm. In other embodiments, the active LED structure emits red light in a peak wavelength range of 600 nm to 650 nm. The LED chip can also be covered with one or more lumiphors or other conversion materials, such as phosphors, such that at least some of the light from the LED passes through the one or more phosphors and is converted to one or more different wavelengths of light. In some embodiments, the LED chip emits a generally white light combination of light from the active LED structure and light from the one or more phosphors. The one or more phosphors may include yellow (e.g., YAG:Ce), green (LuAg:Ce), and red ($Ca_{1-x-y}Sr_xEu_yAlSiN_3$) emitting phosphors, and combinations thereof.

The present disclosure can include LED chips having a variety of geometries, such as vertical geometry or lateral geometry. A vertical geometry LED chip typically includes an anode and cathode on opposing sides of the active LED structure. A lateral geometry LED chip typically includes an anode and a cathode on the same side of the active LED structure that is opposite a substrate, such as a growth substrate or a carrier substrate. In some embodiments, a lateral geometry LED chip may be mounted on a submount of an LED package such that the anode and cathode are on a face of the active LED structure that is opposite the submount. In this configuration, wire bonds may be used to provide electrical connections with the anode and cathode. In other embodiments, a lateral geometry LED chip may be flip-chip mounted on a submount of an LED package such that the anode and cathode are on a face of the active LED structure that is adjacent to the submount. In this configuration, electrical traces or patterns may be provided on the submount for providing electrical connections to the anode and cathode of the LED chip. In a flip-chip configuration, the active LED structure is configured between the substrate of the LED chip and the submount for the LED package. Accordingly, light emitted from the active LED structure may pass through the substrate in a desired emission direction. In some embodiments, the flip-chip LED chip may be configured as described in commonly-assigned U.S. Patent Application Publication No. 2017/0098746, which is hereby incorporated by reference herein.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure.

FIG. 4 is a perspective view of an LED package 46 according to some embodiments. The LED package 46 includes a submount 48 that can be formed of many different materials with a preferred material being electrically insulating. Suitable materials include, but are not limited to ceramic materials such as aluminum oxide or alumina, AlN, or organic insulators like polyimide (PI) and polyphthalamide (PPA). In other embodiments the submount 48 can comprise a printed circuit board (PCB), sapphire, Si or any other suitable material. For PCB embodiments, different PCB types can be used such as standard FR-4 PCB, metal core PCB, or any other type of PCB. At least a portion of a metal pattern 50 is visible on the submount 48. Package contacts 52-1, 52-2 comprise at least a portion of the metal pattern 50 and include an anode contact and a cathode contact configured to receive an electrical connection from a power source external to the LED package 46. In some embodiments, a portion 51 of the submount 48 includes identification or other information about the LED package 46, including a quick response (QR) code, a bar code, or alphanumeric information. In FIG. 4, the portion 51 is illustrated between the package contacts 52-1, 52-2. However, in other embodiments, the portion 51 that includes identification or other information may be located on other areas of the submount 48.

A plurality of LED chips 54-1 to 54-3 are visible on the submount 48, and a light-altering material 56 is arranged around a perimeter of the LED chips 54-1 to 54-3 on a surface of the submount 48. While the LED package 46 is designed with three LED chips 54-1 to 54-3, any number of LED chips are possible. In some embodiments, LED packages according to embodiments disclosed herein may include a single LED chip, or two LED chips, or three LED chips, or more. In some embodiments, the light-altering material 56 is configured to redirect or reflect laterally-emitting light from the LED chips 54-1 to 54-3 toward a desired emission direction. In other embodiments, the light-altering material 56 may block or absorb at least of portion of any laterally-emitting light from the LED chips 54-1 to 54-3 that would otherwise escape the LED package 46 with high or wide emission angles. The light-altering material 56 may partially cover the submount 48 outside of where the LED chips 54-1 to 54-3 are located. In that regard, the light-altering material 56 may cover portions of the metal pattern 50 that extend from the package contacts 52-1, 52-2 to the LED chips 54-1 to 54-3. The light-altering material 56 may be adapted for dispensing, or placing, and may include many different materials including light-reflective materials that reflect or redirect light, light-absorbing materials that absorb light, and materials that act as a thixotropic agent. In some embodiments, the light-altering material 56 may include at least one of fused silica, fumed silica, and titanium dioxide (TiO$_2$) particles suspended in a binder, such as silicone or epoxy. In some embodiments, the light-altering material 56 may comprise a white color to reflect and redirect light. In other embodiments, the light-altering material 56 may comprise an opaque or black color for absorbing light and increasing contrast of the LED package 46. The light-altering material 56 can be dispensed or deposited in place using an automated dispensing machine where any suitable size and/or shape can be formed. The light-altering material 56 may include a cross-sectional profile comprising a planar top surface with vertical side surfaces or a curved top surface with vertical side surfaces. In other embodiments, the light-altering material 56 may comprise other shapes, including a planar or curved top surface with non-planar or non-vertical side surfaces. In some embodiments, at least a portion of the light-altering material 56 may extend to one or more edges of the submount 48. In FIG. 4, the light-altering material 56 extends to three edges of the submount 48, but does not extend to a fourth edge of the submount 48, thereby leaving the package contacts 52-1, 52-2 uncovered.

In some embodiments, a wavelength conversion element 58 is arranged over the plurality of LED chips 54-1 to 54-3 on the submount 48. In some embodiments, the light-altering material 56 is also arranged around a perimeter of the wavelength conversion element 58. In some embodiments, the wavelength conversion element 58 includes one or more lumiphoric materials. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, spray coating, inkjet printing, or the like). In certain embodiments, lumiphoric materials may be deposited utilizing one or more applications of a spray coating after the LED chip is mounted on the submount 48, as described in commonly-assigned U.S. Patent Application Publication No. 2017/0098746. In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphors (e.g., YAG:Ce), green phosphors (LuAg:Ce), and red phosphors (Cai-xySrxEuyAlSiN3) and combinations thereof. In certain embodiments, the wavelength conversion element 58 includes embodiments as described in commonly-assigned U.S. Patent Application Publication No. 2018/0033924, which is hereby incorporated by reference herein.

FIG. 5A illustrates a top view of a partially-assembled LED package 60 according to some embodiments. The LED package 60 is similar to the LED package 46 of FIG. 4, except only the submount 48 and the metal pattern 50 are present. The metal pattern 50 includes a plurality of metal traces 50-1 to 50-5. Each metal trace 50-1 to 50-5 includes a continuous metal formed on a surface of the submount 48, and each metal trace 50-1 to 50-5 is discontinuous with each other. The metal pattern 50 forms a plurality of die attach pads 61-1 to 61-3 that are indicated by dashed-line boxes in FIG. 5A. The die attach pads 61-1 to 61-3 are configured to receive a plurality of LED chips. For example, the die attach pad 61-1 includes a portion of the metal trace 50-1 and a portion of the metal trace 50-4. Accordingly, an anode of an LED chip may be mounted or attached to the metal trace 50-1 while a cathode of the LED chip may be mounted or attached to the metal trace 50-4. In a similar manner, the die attach pad 61-2 includes a portion of the metal trace 50-4 and a portion of the metal trace 50-5, and the die attach pad 61-3 includes a portion of the metal trace 50-2 and a portion of the metal trace 50-5. Additionally, a portion of the metal trace 50-1 and a portion of the metal trace 50-2 form bond pads 62-1 and 62-2, respectively. The bond pads 62-1, 62-2 form a portion of the package contacts 52-1, 52-2 of FIG. 4. In that regard, the metal trace 50-1 is continuous with at least a portion of the die attach pad 61-1 and the bond pad 62-1; and the metal trace 50-2 is continuous with at least a portion of the die attach pad 61-3 and the bond pad 62-2. In some embodiments, the metal pattern 50 includes one or more test tabs 63-1, 63-2 that allow for individual testing of LED chips that are mounted to the die attach pads 61-1 to 61-3. For example, in FIG. 5A, the metal trace 50-4 includes the test tab 63-1 and the metal trace 50-5 includes the test tab 63-2. The one or more test tabs 63-1, 63-2 are outside an area of the die attach pads 61-1 to 61-3. In that regard, the one or more test tabs 63-1, 63-2 are accessible after LED chips are mounted in the LED package 60.

The metal pattern 50 may include any number of electrically conductive materials. In some embodiments, the metal pattern 50 includes at least one of the following; copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, the metal pattern 50 includes a first layer of Cu or Ni followed by a layer of ENEPIG or ENIG that conformally covers a top and sidewalls of the first layer of Cu or Ni.

FIG. 5B illustrates a top view of a partially-assembled LED package 64 according to some embodiments. The LED package 64 is similar to the LED package 60 of FIG. 5A, except a plurality of LED chips 66-1 to 66-3 and a plurality of ESD chips 68-1, 68-2 are mounted on the metal pattern 50. In some embodiments, an anode of the first LED chip 66-1 is mounted or attached to the first metal trace 50-1 while a cathode of the first LED chip 66-1 is mounted or attached to the fourth metal trace 50-4. An anode of the second LED chip 66-2 is mounted or attached to the fourth metal trace 50-4 while a cathode of the second LED chip 66-2 is mounted or attached to the fifth metal trace 50-5. An anode of the third LED chip 66-3 is mounted or attached to the fifth metal trace 50-5 while a cathode of the third LED chip 66-3 is mounted or attached to the second metal trace 50-2. In that regard, each of the plurality of LED chips 66-1 to 66-3 are electrically connected in series with each other between the first metal trace 50-1 and the second metal trace 50-2. In some embodiments, the LED chips 66-1 to 66-3 may be flip-chip mounted to the metal traces 50-1, 50-2, 50-4, 50-5. The LED chips 66-1 to 66-3 may be configured as described in commonly-assigned U.S. Patent Application Publication No. 2017/0098746, which is hereby incorporated by reference herein.

The first ESD chip 68-1 is attached or mounted to the first metal trace 50-1 and the third metal trace 50-3, and the second ESD chip 68-2 is attached or mounted to the third metal trace 50-3 and the second metal trace 50-2. In that regard, each of the plurality of ESD chips 68-1, 68-2 are electrically connected in series between the first metal trace 50-1 and the second metal trace 50-2. Stated differently, the first ESD chip 68-1 is electrically connected to the first metal trace 50-1, the second ESD chip 68-2 is electrically connected to the second metal trace 50-2, and the third metal trace 50-3 is serially connected between the first ESD chip 68-1 and the second ESD chip 68-2. In this manner, the first ESD chip 68-1 and the second ESD chip 68-2 are arranged in parallel with the LED chips 66-1 to 66-3 between the first metal trace 50-1 and the second metal trace 50-2.

As previously described, the one or more test tabs 63-1, 63-2 are configured to allow for individual testing of the LED chips 66-1 to 66-3 after the LED chips 66-1 to 66-3 and the ESD chips 68-1, 68-2 are mounted to the LED package 64. For example, the LED chip 66-1 may be individually tested via electrical contacts to the first metal trace 50-1 and the test tab 63-1; the LED chip 66-2 may be individually tested via electrical contacts to the one or more test tabs 63-1, 63-2; and finally, the LED chip 66-3 may be individually tested via electrical contacts to the test tab 63-2 and the metal trace 50-2. Furthermore, subgroups of the LED chips 66-1 to 66-3 may be tested together. For example, the LED chips 66-1 and 66-2 may be tested as a pair via electrical contacts to the metal trace 50-1 and the test tab 63-2.

FIG. 5C illustrates a top view of an LED package 70 according to some embodiments. The LED package 70 is similar to the LED package 64 of FIG. 5B, except the LED package 70 includes the light-altering material 56 and the wavelength conversion element 58 as previously-described. As illustrated, the LED chips 66-1 to 66-3 are laterally spaced from the bond pads 62-1, 62-2 on the submount 48. The light-altering material 56 is arranged around a perimeter of the LED chips 66-1 to 66-3 on a surface of the submount 48. Notably, the light-altering material 56 covers the first ESD chip 68-1 and the second ESD chip 68-2 of FIG. 5B on the surface of the submount 48. ESD chips are typically dark in color and may therefore absorb light. The light-altering material 56 may include light reflective particles as previously described, and accordingly, the amount of light from the LED chips 66-1 to 66-3 that may reach the ESD chips (68-1, 68-2 of FIG. 5B) is reduced. In some embodiments, the light-altering material 56 does not cover the entire surface of the submount 48. In particular, a portion of the first metal trace 50-1 and a portion of the second metal trace 50-2 are not covered by the light-altering material 56. In that regard, the bond pads 62-1, 62-2 of the metal traces 50-1, 50-2 form at least a portion of the package contacts (see, for example 52-1, 52-2 of FIG. 4). Under some operating conditions, the portions of the metal traces 50-1, 50-2 that are not covered by the light-altering material 56 may experience corrosion that adversely impacts the performance of the LED package 70. For example, Cu is known to be susceptible to oxidation with exposure to air. In embodiments where the metal traces 50-1, 50-2 include Cu, portions of the metal traces 50-1, 50-2 may form Cu oxide that is black in color. In some embodiments, the metal traces 50-1, 50-2 may further include a surface finish such as ENEPIG; however, corrosion and oxidation of the metal traces 50-1, 50-2 may still occur under some operation conditions.

FIG. 5D illustrates a bottom view of the LED package 70 of FIG. 5C according to some embodiments. In some embodiments, the bottom side of the submount 48 may include a mount pad 71 that is configured for mounting the LED package 70 to another surface, such as a PCB or a housing for a lighting fixture. The bottom side is a face of the submount 48 that is opposite a face where the LED chips 66-1 to 66-3 of FIG. 5C are mounted. The mount pad 71 may include a metal, such as Cu or alloys thereof, Ni or alloys thereof, NiCr, Au or alloys thereof, electroless Au, electroless Ag, NiAg, Al or alloys thereof, TiW, TiWN, ENEPIG, ENIG, HASL, and OSP. In some embodiments, the mount pad 71 includes a thickness that is similar to a thickness of the metal pattern 50 (FIG. 5B). In some embodiments where the mount pad 71 includes a metal, the mount pad 71 may be configured to provide a metal-to-metal bond with a corresponding metal pad that is located on another surface. In operation, the mount pad 71 may also provide a thermal path, or a heat sink, that assists in dissipating heat generated by the LED package 70. Additionally, the mount pad 71 may provide structural integrity for the LED package 70 during various manufacturing steps. For example, before singulation, the LED package 70 may be part of a larger panel of LED packages, each of which includes a corresponding mount pad. Each of the corresponding mount pads may assist in keeping the panel flat during subsequent processing steps. In other embodiments, it may be desirable to mount the LED package 70 to another surface without a mount pad 71. For example, the LED package 70 may be glued directly to another surface without a mount pad 71.

FIG. 6A illustrates a top view of an LED package 72 according to some embodiments. The LED package 72 is similar to the LED package 70 of FIG. 5C, except the LED package 72 includes a bond metal 74 that covers the bond pads 62-1, 62-2 of the exposed portions of the metal traces 50-1, 50-2. The one or more test tabs 63-1, 63-2 of FIG. 5A and FIG. 5B are not shown in FIG. 6A, but it is understood the one or more test tabs 63-1, 63-2 are applicable to all embodiments disclosed herein, including FIG. 6A. The bond metal 74 may include one or more layers of a conductive metal that is configured to receive and bond with an external electrical connection. The bond metal 74 may comprise a different metal than the metal traces 50-1, 50-2. For example, in some embodiments, the bond metal 74 includes Al or alloys thereof and is arranged to be bonded with one or more wire bonds that are electrically connected to an external power source. In other embodiments, the bond metal 74 and the metal traces 50-1, 50-2 may include different metals selected from the following: Cu or alloys thereof, Ni or alloys thereof, NiCr, Au or alloys thereof, electroless Au, electroless Ag, NiAg, Al or alloys thereof, TiW, TiWN, ENEPIG, ENIG, HASL, and OSP. In this manner, the bond metal 74 and the bond pads 62-1, 62-2 collectively form package contacts as previously described (see, for example 52-1, 52-2 of FIG. 4). The bond metal 74 may be formed by various deposition techniques including sputtering, evaporation, plating, and patterning. Patterning may include various techniques that include masking and/or etching back of deposited material. The bond metal 74 is on the bond pads 62-1, 62-2 and on a surface of the submount 48 that is adjacent the bond pads 62-1, 62-2. Stated differently, the bond metal 74 covers the portions of the metal traces 50-1, 50-2 that are uncovered by the light-altering material 56 and the wavelength conversion element 58. In this manner, the bond metal 74 serves as a barrier between the metal traces 50-1, 50-2 and the surrounding atmosphere, thereby reducing potential corrosion of the metal traces 50-1, 50-2. Accordingly, in this configuration, the bond metal 74 serves as a corrosion-reducing layer. In some embodiments, a portion of the bond metal 74 extends underneath the light-altering material 56 such that the portion of the bond metal 74 is between the light-altering material 56 and the submount 48.

FIG. 6B illustrates a top view of a partially-assembled LED package 76 according to some embodiments. The LED package 76 is similar to the LED package 72 of FIG. 6A, except the light-altering material 56 and the wavelength conversion element 58 of FIG. 6A are not present. The LED package 76 includes the LED chips 66-1 to 66-3 and the ESD chips 68-1, 68-2 serially connected by the metal trace 50-3 as previously described. As illustrated, the bond metal 74 covers portions of the metal traces 50-1, 50-2 and includes bond metal portions 74' that are covered after the light-altering material of previous embodiments is formed.

FIG. 6C is a side view illustration representing a cross-section taken along section line II-II of the LED package 76 of FIG. 6B. A portion of the first metal trace 50-1 is covered by the bond metal 74. In particular, the bond metal 74 is on a top surface and sidewalls of the portion of the first metal trace 50-1 as well as on a surface of the submount 48 that is adjacent the portion of the first metal trace 50-1. The LED chip 66-1 is on a different portion of the first metal trace 50-1, and the ESD chip 68-1 is on the third trace 50-3. FIG. 6D illustrates the cross-sectional view of the LED package 76 of FIG. 6C with the addition of the light-altering material 56 and the wavelength conversion element 58. Notably, the light-altering material 56 is arranged around a perimeter of the LED chip 66-1 and covers the ESD chip 68-1 on the submount 48.

FIG. 7A illustrates a cross-sectional view of an LED package 80 similar to the LED package 76 of FIG. 6C. The LED package 80 includes the metal traces 50-1, 50-3 on the submount 48, the LED chip 66-1, and the ESD chip 68-1 as previously described. The LED package 80 further includes an alternative configuration of the bond metal 74. The bond metal 74 is on a top surface of a portion of the first metal trace 50-1, but not on sidewalls of the first metal trace 50-1 or on the surface of the submount 48 that is adjacent the portion of the first metal trace 50-1. The bond metal 74 is arranged to receive an electrical connection, such as a wire bond, from an external power source. In this manner, the bond metal 74 and the portion of the metal trace 50-1 collectively form a package contact as previously described (see, for example 52-1, 52-2 of FIG. 4). A corrosion-reducing layer 82 that is distinct from the bond metal 74 is arranged on a sidewall 50-1' of the metal trace 50-1 as well as on the surface of the submount 48 that is adjacent the first metal trace 50-1. The corrosion-reducing layer 82 may include one or more layers that include at least one of a polymer, a dielectric, or a metal that is different from the bond metal 74. In some embodiments, the corrosion-reducing layer 82 includes at least one layer of Au, platinum (Pt), Ni, Ti, TiW, TiWN, or other alloys thereof in embodiments where the bond metal 74 includes Al.

FIG. 7B illustrates a cross sectional view of an LED package 84 similar to the LED package 80 of FIG. 7A. The LED package 84 includes the metal traces 50-1, 50-3 on the submount 48, the LED chip 66-1, and the ESD chip 68-1 as previously described. The LED package 84 further includes an alternative configuration of the bond metal 74. A corrosion-reducing layer 86 that is distinct from the bond metal 74 is arranged to cover the metal trace 50-1, and the bond metal 74 is arranged on the corrosion-reducing layer 86. In that manner, the corrosion-reducing layer 86 is on the top surface and on the sidewall 50-1' of the metal trace 50-1 as well as on the surface of the submount 48 that is adjacent the first metal trace 50-1. In this configuration, the corrosion-reducing layer 86 may include one or more electrically conductive layers that include a metal that is different from the bond metal 74. In some embodiments, the bond metal 74 includes Al and the corrosion-reducing layer 86 includes one or more layers of Pt, Ni, Ti, TiW, or TiWN, or other alloys thereof.

FIG. 7C illustrates a cross sectional view of an LED package 88 similar to the LED package 80 of FIG. 7A. The LED package 88 includes the metal traces 50-1, 50-3 on the submount 48, the LED chip 66-1, and the ESD chip 68-1 as previously described. The LED package 88 further includes an alternative configuration of the bond metal 74. A first corrosion-reducing layer 90 and a second corrosion-reducing layer 91 that are distinct from the bond metal 74 are arranged to cover the metal trace 50-1. The first corrosion-reducing layer 90 is arranged on the top surface and on the sidewall 50-1' of the metal trace 50-1 as well as on the surface of the submount 48 that is adjacent the first metal trace 50-1. The second corrosion-reducing layer 91 is arranged to cover the first corrosion-reducing layer 90 and is also on the surface of the submount 48 that is adjacent the first corrosion-reducing layer 90. The bond metal 74 is arranged on the second corrosion-reducing layer 91. In this configuration, the first corrosion-reducing layer 90 and the second corrosion-reducing layer 91 may include one or more electrically conductive layers that include a metal that is different from the bond metal 74. In some embodiments, the bond metal 74 includes Al, and the first corrosion-reducing layer 90 includes one or more layers of Pt, Ni, Ti, TiW, or TiWN, or other alloys thereof, and the second corrosion-reducing layer 92 includes at least one of ENEPIG or ENIG.

FIG. 7D illustrates a cross sectional view of an LED package 92 similar to the LED package 76 of FIG. 6C. The LED package 92 includes the metal traces 50-1, 50-3 on the submount 48, the bond metal 74, the LED chip 66-1, and the ESD chip 68-1 as previously described. As also previously described, the metal traces 50-1, 50-3 may include additional layers. For example, in FIG. 7D, an additional metal trace layer 93 is formed or coated on the original metal traces 50-1, 50-3 to form metal traces that include the metal trace 50-1, the additional metal trace layer 93 and the metal trace 50-3, and the additional metal trace layer 93. In some embodiments, the additional metal trace layer 93 includes a layer of metal, such as an electroless metal including Au plating that covers the top surfaces and sidewalls of the metal traces 50-1, 50-3 all the way to the submount 48. In that regard, the additional metal trace layer 93 encapsulate the metal traces 50-1, 50-3 and may provide improved corrosion resistance while still enabling good die attach with the LED chip 66-1 or the ESD chip 68-1. Conventional metal traces may include coatings of ENIG, which can have pin holes in the top layer of Au that are susceptible to corrosion, or ENEPIG, which is more corrosion resistant, but provides a poor die attach for the LED chip 66-1 or the ESD chip 68-1. In some embodiments, the additional metal trace layer 93 may replace coatings or treatments of ENIG or ENEPIG, while in other embodiments, the additional metal trace layer 93 may be provided on a top surface and sidewalls to encapsulate coatings or treatments of ENIG or ENEPIG. In some embodiments, the additional metal trace layer 93 include multiple layers.

In order to test LED packages with corrosion-reducing features as previously described, LED packages with and without corrosion-reducing features were subjected to corrosion testing. The corrosion testing including exposing each of the LED packages to an environment including water vapor and sulfur vapor for a time of about two hundred and forty hours. FIG. 8A is a photograph of a portion of a conventional LED package 94. A package contact 96 is visible and includes a first layer of Cu, followed by a layer of ENEPIG, and followed by a bond metal of Al that is only on a top surface of the package contact 96. A wire bond 98 is electrically connected to the package contact 96. After corrosion testing, a corrosion 100 is clearly visible as black material around the perimeter of the package contact 96. FIG. 8B is a photograph of a portion of an LED package 102 according to embodiments of the present disclosure. A package contact 104 is visible and is configured similar to the embodiments described for FIG. 6A. In that manner, the package contact 104 includes a first layer of Cu, followed by a layer of ENEPIG, and followed by a bond metal of Al that covers the layer of Cu and the layer of ENEPIG and is additionally on a surface 106 of the submount 48 that is adjacent the package contact 104. After corrosion testing, corrosion is noticeably reduced around the perimeter of the package contact 104 as compared to the package contact 96 of FIG. 8A.

FIG. 9 illustrates a top view of a partially-assembled LED package 110 according to some embodiments. The LED package 110 includes the submount 48; the metal traces 50-1 to 50-3; the bond pads 62-1 and 62-2 for the LED package 110; the one or more test tabs 63-1, 63-2; the LED chips 66-1 to 66-3; the ESD chips 68-1, 68-2; and the bond metal 74 as previously described. The bond metal 74 includes bond metal portions 74" that are covered after the light-altering material of previous embodiments is formed. The bond metal portions 74", which may also be referred to as conductive fingers, extend on a top surface of each of the metal traces 50-1 and 50-2 away from the bond pads 62-1, 62-2 and in a direction toward the LED chips 66-1 to 66-3. In some embodiments, the bond metal portions 74" extend on the top surface of the metal traces 50-1, 50-2 in a manner that at least a portion of the bond metal portions 74" are in close proximity with, or immediately adjacent the LED chips 66-1 to 66-3. In some embodiments, the bond metal portions 74" extend at least to an edge of the LED chips 66-1, 66-3 that is opposite the edge of the LED chips 66-1, 66-3 that is closest to the bond pads 62-1, 62-2. In this regard, the bond metal 74 is configured to receive an electrical connection at the bond pads 62-1, 62-2 and current may travel within the bond metal 74 to or from a position that is in close proximity or immediately adjacent the LED chips 66-1 and 66-3. In embodiments where the bond metal 74 includes a highly conductive metal such as Al or alloys thereof, the forward voltage of the LED package 110 may be reduced. Additionally, for embodiments where the metal traces 50-1, 50-2 include Au, such as ENEPIG, the amount of Au may be reduced, thereby saving costs without compromising current carrying capabilities of the LED package 110. In some embodiments, the bond metal 74 (inclusive of the bond metal portions 74", or fingers) and the metal traces 50-1, 50-2 may include different metals selected from the following: Cu or alloys thereof, Ni or alloys thereof, NiCr, Au or alloys thereof, electroless Au, electroless Ag, NiAg, Al or alloys thereof, TiW, TiWN, ENEPIG, ENIG, HASL, and OSP.

FIG. 10 illustrates a top view of a partially-assembled LED package 112 according to some embodiments. The LED package 112 includes the submount 48; the metal traces 50-1 to 50-3; the bond pads 62-1 and 62-2 for the LED package 112; the one or more test tabs 63-1, 63-2; the LED chips 66-1 to 66-3; the ESD chips 68-1, 68-2; the bond metal 74 and the bond metal portions 74" as previously described. The LED package 112 is similar to the LED package 110 of FIG. 9, except the bond metal 74 covers at least a portion of the metal traces 50-1 and 50-2. Accordingly, the bond metal 74 is also on a surface of the submount 48 that is adjacent portions of the metal traces 50-1 and 50-2. In that regard, after the light-altering material and the wavelength conversion element of previous embodiments is formed, all portions of the metal traces 50-1 and 50-2 that are uncovered by the light-altering material and the wavelength conversion element are covered by the bond metal 74. Accordingly, the bond pads 62-1, 62-2 for the LED package 112 are more resistant to corrosion.

FIG. 11A is a plot comparing electrical performance of LED packages with and without conductive fingers of the bond metal as described for FIG. 9 and FIG. 10. The bottom of the plot details various LED packages built for the comparisons. As indicated, the various LED packages were built with and without conductive fingers of the bond metal (Al in this case) and as indicated by the "Al finger extension" row with labels Yes (with Al conductive fingers) or No (without Al conductive fingers). The metal traces underneath the bond metal as well as the portions of the metal traces that form the die attach pads as previously described included Au with variable thicknesses as measured in a direction perpendicular to the submount. The Au thickness was varied from 1 to 3 µm for various LED packages as indicated by the "Au Thickness" row. Additionally, a width of the metal trace that extends between and connects the package bond pads and the die attach pads was varied between 450 and 550 µm, as indicated by the label "Side Au metal trace" row. The number of LED chips, or LED die, was also varied between 2 and 3 chips as indicated by the "Die number" row. The y-axis of the plot is the electrical resistance of the metal traces for a fixed current in milliohms. Notably, for every data set of LED packages having the same Au thickness, width, and number of LED chips, the LED packages with Al finger extensions have a substantially decreased electrical resistance. As expected, the resistance of the metal traces also decreases when the Au thickness or width is increased. However, extra Au can add additional costs to the LED package. In that regard, LED packages with metal traces having an Au thickness of 2 µm and including Al finger extensions measured a lower electrical resistance than LED packages with metal traces having an Au thickness of 3 μm and without Al finger extensions. Additionally, for packages with an Au thickness reduced to 1 μm and with Al finger extensions, the electrical resistance was measured close or similar to LED packages having an Au thickness of 2 μm and without Al finger extensions. Accordingly, some embodiments of the present invention include metal traces having an Au thickness of less than 2 μm, or in a range from 1 μm to 2 μm, or in a range from 1 μm to less than 2 μm.

FIG. 11B includes a plot comparing electrical performance of LED packages after die attach for LED packages with and without conductive fingers of the bond metal as described for FIG. 9 and FIG. 10. The bottom of the plot details various LED packages built for the comparisons. As with FIG. 11A, the various LED packages were built with and without conductive fingers of the bond metal (Al in this case) and as indicated by the "Al finger extension" row with labels Yes (with Al conductive fingers); No (without Al conductive fingers); or POR (e.g. process of record and without Al conductive fingers). The metal traces underneath the bond metal as well as the portions of the metal traces that form the die attach pads as previously described included Au with variable thicknesses as measured in a direction perpendicular to the submount. The Au thickness was varied from 1 to 3 μm for various LED packages as indicated by the "Au Thickness" row. Additionally, a width of the metal trace that extends between and connects the LED package bond pads and the die attach pads was varied between 450 and 550 μm, as indicated by the label "Side Au metal trace" row. The "Au Thickness" row and the "Side Au metal trace" row also include the label POR, which does not include Al. The number of LED chips, or LED die, was also varied between 2 and 3 chips as indicated by the "Die number" row. The y-axis of the top portion of the plot is the change in forward voltage ($V_f$), or $V_f$ Delta, in volts, and the y-axis at the bottom portion of the plot is the percentage change in $V_f$, or $V_f$ Delta %, in volts. The table at the bottom of FIG. 11B summarizes the mean values for $V_f$ Delta and $V_f$ Delta % for the number N of LED packages tested. Delta refers to the difference between the POR cells without the Al finger and the other cells with the Al finger. Notably, the presence of an Al finger extension generally improves (lowers) $V_f$, although as the Au thickness increases, the improvement becomes less pronounced. For example, for LED packages with 1 μm of Au, the Al finger provides a mean $V_f$ improvement of about 0.044 volts, or 44 millivolts (mV); for LED packages with 2 μm of Au, the Al finger provides a mean $V_f$ improvement of about 21 mV; and for LED packages with 3 μm of Au, the Al finger provides a mean $V_f$ improvement of about 12 mV. Accordingly, the presence of an Al finger extension and metal traces with Au as previously described can each lower the $V_f$ values closer to the POR while also providing the corrosion resistance as previously described.

FIG. 12A is a cross-sectional view of an LED package 114 according to some embodiments. The cross-sectional view may be similar to a cross-section taken along section line I-I of the LED package 72 of FIG. 6A. The LED package 114 includes the submount 48; the metal traces 50-1, 50-2, 50-4, 50-5; the LED chips 66-1 to 66-3; the light-altering material 56; and the wavelength conversion element 58 as previously described. The wavelength conversion element 58 includes a superstrate 116 that includes a lumiphoric material 118 disposed thereon. The term "superstrate" as used herein refers to an element placed on an LED chip with a lumiphoric material between the superstrate and the LED chip. The term "superstrate" is used herein, in part, to avoid confusion with other substrates that may be part of the semiconductor light emitting device, such as a growth or carrier substrate of the LED chip or a submount of the LED package. The term "superstrate" is not intended to limit the orientation, location, and/or composition of the structure it describes. In some embodiments, the superstrate 116 may be composed of, for example, sapphire, silicon carbide, silicone, and/or glass (e.g., borosilicate and/or fused quartz). The superstrate 116 may be patterned to enhance light extraction from the LED chips 66-1 to 66-3 as described in commonly-assigned U.S. Provisional Application No. 62/661,359 entitled "Semiconductor Light Emitting Devices Including Superstrates With Patterned Surfaces", the subject matter of which was later filed in U.S. patent application Ser. No. 16/390,714, filed Apr. 22, 2019, now U.S. Pat. No. 11,309,462, which hereby incorporated by reference herein. The superstrate 116 may also be configured as described in previously-referenced U.S. Patent Application Publication No. 2018/0033924, also incorporated by reference herein. The superstrate 116 may be formed from a bulk substrate which is optionally patterned and then singulated. In some embodiments, the patterning of the superstrate 116 may be performed by an etching process (e.g., wet or dry etching). In some embodiments, the patterning of the superstrate 116 may be performed by otherwise altering the surface, such as by a laser or saw. In some embodiments, the superstrate 116 may be thinned before or after the patterning process is performed. The lumiphoric material 118 may then be placed on the superstrate 116 by, for example, spraying and/or otherwise coating the superstrate 116 with the lumiphoric material 118. The superstrate 116 and the lumiphoric material 118 may be attached to the LED chips 66-1 to 66-3 using, for example, a layer of transparent adhesive 119. In some embodiments, when the superstrate 116 is attached to the LED chips 66-1 to 66-3, a portion of the transparent adhesive 119 is positioned at least partially between lateral edges of the LED chips 66-1 to 66-3. In some embodiments, the layer of the transparent adhesive 119 may include silicone with a refractive index in a range of about 1.3 to about 1.6 that is less than a refractive index of the LED chips 66-1 to 66-3. In this manner, at least a portion of light emitted laterally from the LED chips 66-1 to 66-3 may have improved light extraction between the lateral edges of the LED chips 66-1 to 66-3, thereby providing improved overall package brightness as well as improved homogeneity of composite emissions from the LED chips 66-1 to 66-3. Stated differently, the appearance of dark spots due to illumination gaps between the LED chips 66-1 to 66-3 may be reduced.

FIG. 12B illustrates a cross-sectional view of the LED package 114 of FIG. 12A with a lens 120. In some embodiments, the lens 120 may be added to the LED package 114 to improve color angle uniformity. For example, the lens 120 may be configured to reduce the appearance of blue emissions around a lateral perimeter of the LED package 114. The lens 120 may also provide a different light distribution pattern for the LED package 114. In some embodiments, the lens 120 may include a curved upper surface, such as a partial hemisphere, a partial dome, or a partial ellipsoid. In further embodiments, the lens 120 may include a curved upper surface with one or more planar sidewalls. In other embodiments, the lens 120 may have a planar upper surface with planar sidewalls. Many different materials can be used for the lens 120, including silicones, plastics, epoxies, or glass, with a suitable material being compatible with dispensing or molding processes. Silicone is suitable for dispensing or molding and provides good optical transmission properties for light emitted from the LED chips 66-1 to 66-3.

In some embodiments, the lens 120 may be dispensed on a surface of the LED package 114. The viscosity of the material used for the lens 120 may be such that the curved upper surface is formed by surface tension. In other embodiments, the lens 120 may be molded over the LED package 114. In some embodiments, the lens 120 may be dispensed or molded onto the superstrate 116 before it is placed in the LED package 114. Alternatively, the lens 120 may be dispensed or molded onto the LED package 114 after the superstrate 116 has been added. In this manner, the lens 120 may extend over both the superstrate 116 and the light-altering material 56.

The LED package 114 may further include an additional light-altering material 121. The additional light-altering material 121 may include at least one of a second lumiphoric material or a light-diffusing material. In some embodiments, the additional light-altering material 121 includes a second lumiphoric material that is either the same as or different than the lumiphoric material 118 (or a first lumiphoric material). In embodiments where the additional light-altering material 121 includes a light-diffusing material, the light-diffusing material may scatter light emitted from the LED chips 66-1 to 66-3 for improvements in color uniformity and color mixing. The additional light-altering material 121 may be formed by deposition or other suitable techniques on the LED package 114 before the lens 120 is formed. In other embodiments, the additional light-altering material 121 may be formed at the same time the lens 120 is formed. For example, the additional light-altering material 121 may include at least one of lumiphoric particles or light-diffusing particles that are suspended in a silicone material. The silicone material may then be dispensed or molded to form the lens 120. For a dispensing process, the silicone material may be cured after the additional light-altering material 121 is allowed to settle closer to the LED chips 66-1 to 66-3. In other embodiments, the silicone material may be cured while the additional light-altering material 121 is distributed throughout the lens 120.

Figure 12C:
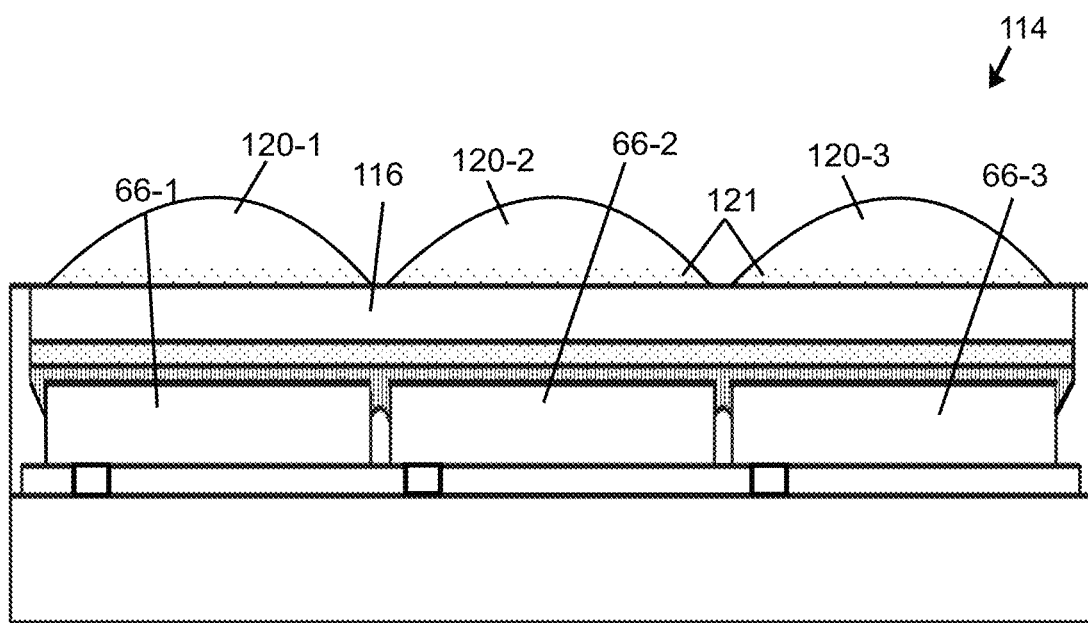
FIG. 12C illustrates a cross-sectional view of the LED package of FIG. 12A with a plurality of lenses according to some embodiments.

FIG. 12C illustrates a cross-sectional view of the LED package 114 of FIG. 12A with a plurality of lenses 120-1 to 120-3 according to some embodiments. Each of the plurality of lenses 120-1 to 120-3 may be registered with corresponding ones of the plurality of LED chips 66-1 to 66-3. In some embodiments, each of the plurality of lenses 120-1 to 120-3 may comprise a portion of the additional light-altering material 121. In other embodiments, the additional light-altering material 121 may not be present in all of the plurality of lenses 120-1 to 120-3. Individual ones of the plurality of lenses 120-1 to 120-3 may have different shapes than other lenses of the plurality of lenses 120-1 to 120-3 to provide different light emission patterns. In some embodiments, the superstrate 116 may be continuous between the plurality of LED chips 66-1 to 66-3 and the plurality of lenses 120-1 to 120-3. In other embodiments, the superstrate 116 may be divided into a plurality of individual pieces that are each registered with a corresponding lens 120-1 to 120-3 and a corresponding LED chip 66-1 to 66-3.

Embodiments of the present disclosure are not limited to the previously described LED packages. For example, FIG. 13A, FIG. 13B, FIG. 13C, and FIG. 13D illustrate top, bottom, and cross-sectional views respectively of a partially-assembled LED package 122 according to some embodiments. The LED package 122 is similar to previous embodiments, except the package contacts 52-1, 52-2 are on a backside of the submount 48, rather than a frontside of the submount 48 as previously described. The LED package 122 additionally includes the metal traces 50-1 to 50-5; the one or more test tabs 63-1, 63-2; the LED chips 66-1 to 66-3; and the ESD chips 68-1, 68-2 as previously described. One or more conductive vias 124-1 to 124-4 extend through the submount 48 to electrically connect the first metal trace 50-1 and the second metal trace 50-2 to the package contacts 52-1, 52-2, respectively. As illustrated in the bottom view of FIG. 13B, the LED package 122 may further include a thermal pad 125 on the backside of the submount 48. In some embodiments, the thermal pad 125 includes the same materials as the package contacts 52-1, 52-2. In other embodiments, the thermal pad 125 includes different materials. The thermal pad 125 may be electrically isolated from the package contacts 52-1, 52-2 and may be configured to spread heat away from the LED chips 66-1 to 66-3 through the submount 48. FIG. 13C illustrates an alternative configuration for the backside of the submount 48. In FIG. 13C, the package contacts 52-1, 52-2 are larger and take up more surface area on the backside of the submount 48. Accordingly, the package contacts 52-1, 52-2 are electrically connected to the LED chips 66-1 to 66-3 and may also spread heat away from the LED chips 66-1 to 66-3 through the submount 48. FIG. 13D is a side view illustration representing a cross-section of the LED package 122 taken along section line III-III of FIG. 13A. The first metal trace 50-1 and the package contact 52-1 are shown on opposite faces of the submount 48. The conductive vias 124-1, 124-2 extend through the submount 48 to electrically connect the first metal trace 50-1 to the package contact 52-1. In FIG. 13D, the first metal trace 50-1 and the package contact 52-1 are illustrated as having multiple layers 50-1', 50-1" and 52-1', 52-1" respectively. The multiple layers 50-1', 50-1" and 52-1', 52-1" may include any number of electrically conductive materials as described above. In some embodiments, the layers 50-1' and 52-1' include Au, ENIG, or ENEPIG and the layers 50-1" and 52-1" include an electroless Au plating. In FIG. 13D, the layer 52-1" is illustrated as covering sidewalls of the layer 50-1'. In other embodiments, the layer 52-1" may only cover a surface of the layer 50-1' without covering the sidewalls.

In some embodiments, methods of manufacturing LED packages as disclosed herein, include forming multiple LED packages at the same time on a panel and then singulating individual LED packages. FIG. 14 illustrates a top view of a panel 126 from an intermediate step of manufacturing according to some embodiments disclosed herein. As illustrated, the panel 126 includes a plurality of partially-formed LED packages 128-1 to 128-9. While nine LED packages are illustrated, embodiments of the present disclosure are applicable to any number of LED packages, including more than one hundred LED packages in some embodiments. A plurality of first metal patterns 130-1 to 130-6 and a plurality of second metal patterns 132-1 to 132-6 are arranged on the panel 126 around a perimeter of the partially-formed LED packages 128-1 to 128-9. The plurality of first metal patterns 130-1 to 130-6 and the plurality of second metal patterns 132-1 to 132-6 are formed at the same time as metal patterns of the partially-formed LED packages 128-1 to 128-9 are formed. In some embodiments, the plurality of first metal patterns 130-1 to 130-6 include the same metal layer or layers as package contacts (e.g. 52-1, 52-2 of FIG. 4) of the partially-formed LED packages 128-1 to 128-9, and the plurality of second metal patterns 132-1 to 132-6 include the same metal or metal layers as die attach pads (e.g. 61-1 to 61-3 of FIG. 5A) of the partially-formed LED packages 128-1 to 128-9. In this regard, the first metal patterns 130-1 to 130-6 and the second metal patterns 132-1 to 132-6 may be tested and characterized after deposition without damaging or impacting metal layers of the partially-formed LED packages 128-1 to 128-9. In additional manufacturing steps, LED chips and ESD chips may be mounted to each of the partially-formed LED packages 128-1 to 128-9 as previously described. In further manufacturing steps, the light-altering material and the wavelength conversion element as previously described may be added to complete formation of the LED packages 128-1 to 128-9.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
   a submount;
   a metal trace on the submount, wherein the metal trace comprises:
      at least one die attach pad; and
      at least one bond pad;
   at least one LED chip mounted on the at least one die attach pad;
   a bond metal on a top surface of the at least one bond pad; and
   a corrosion-reducing layer on a sidewall of the at least one bond pad and on a surface of the submount that is adjacent the at least one bond pad.

2. The LED package of claim 1, wherein the corrosion-reducing layer comprises a polymer material.

3. The LED package of claim 1, wherein the corrosion-reducing layer comprises a dielectric material.

4. The LED package of claim 1, wherein the corrosion-reducing layer comprises a metal that is different than the bond metal.

5. The LED package of claim 4, wherein the corrosion-reducing layer comprises at least one of gold, platinum, nickel, titanium, titanium tungsten, and titanium tungsten nitride.

6. The LED package of claim 5, wherein the bond metal comprises aluminum.

7. The LED package of claim 1, wherein the corrosion-reducing layer is directly on the surface of the submount that is adjacent to the at least one bond pad.

8. The LED package of claim 1, wherein the sidewall of the at least one bond pad is devoid of the bond metal.

9. The LED package of claim 1, wherein the corrosion-reducing layer is further arranged on only a portion of the top surface of the at least one bond pad that is outside of the bond metal.

10. The LED package of claim 1, wherein the metal trace is continuous between the at least one bond pad and at least a portion of the at least one die attach pad.

11. The LED package of claim 10, wherein the bond metal is further arranged on a top surface of a portion of the metal trace.

12. The LED package of claim 11, further comprising a light-altering material arranged around a perimeter of the at least one LED chip on the submount, wherein the light-altering material covers a portion of the bond metal that is on the top surface of the portion of the metal trace and the at least one bond pad is uncovered by the light-altering material.

13. The LED package of claim 12, further comprising a wavelength conversion element on the at least one LED chip, wherein the light-altering material is arranged around a perimeter of the wavelength conversion element.

14. A light-emitting diode (LED) package comprising:
   a submount;
   a metal trace on the submount, wherein the metal trace comprises:
      at least one die attach pad; and
      at least one bond pad, wherein the metal trace is continuous between the at least one die attach pad and the at least one bond pad;
   at least one LED chip mounted on the at least one die attach pad;
   a first corrosion-reducing layer on a top surface of the at least one bond pad and on a sidewall of the at least one bond pad; and
   a bond metal on the first corrosion-reducing layer.

15. The LED package of claim 14, wherein the first corrosion-reducing layer is on a surface of the submount that is adjacent the at least one bond pad.

16. The LED package of claim 14, wherein the first corrosion-reducing layer is arranged to cover the entire top surface of the at least one bond pad.

17. The LED package of claim 14, wherein the first corrosion-reducing layer is arranged to cover the entire metal trace.

18. The LED package of claim 14, further comprising a second corrosion-reducing layer that is arranged on the first corrosion-reducing layer, wherein the second corrosion-reducing layer is arranged between the bond metal and the first corrosion-reducing layer.

19. The LED package of claim 18, wherein the second corrosion-reducing layer is on a surface of the submount that is adjacent the first corrosion-reducing layer.

20. The LED package of claim 18, wherein the first corrosion-reducing layer comprises a first metal that is different than the bond metal, and the second corrosion-reducing layer comprises a second metal that is different than the bond metal.

21. The LED package of claim 20, wherein:
   the first corrosion-reducing layer comprises at least one of gold, platinum, nickel, titanium, titanium tungsten, and titanium tungsten nitride;
   the second corrosion-reducing layer comprises at least one of electroless nickel electroless palladium immersion gold and electroless nickel immersion gold; and
   the bond metal comprises aluminum.

\* \* \* \* \*